[19] United States Patent
Abiko et al.

[11] Patent Number: 5,193,070
[45] Date of Patent: Mar. 9, 1993

[54] TRANSVERSAL FILTER CIRCUIT HAVING TAP CIRCUITS INCLUDING BIDIRECTIONAL SHIFT REGISTERS FOR SERIAL MULTIPLICATION

[75] Inventors: Shigeshi Abiko, Tokyo; Shoji Saiki, Yokohama, both of Japan

[73] Assignee: Texas Instruments Incorporated, Dallas, Tex.

[21] Appl. No.: 700,725

[22] Filed: May 15, 1991

[51] Int. Cl.[5] ............................................. G06F 15/31
[52] U.S. Cl. ........................... 364/724.16; 364/724.01
[58] Field of Search ...................... 364/724.16, 724.01; 375/118, 120

[56] References Cited

U.S. PATENT DOCUMENTS 4,791,596 12/1988 Harbich ........................... 364/724.16
4,843,581 6/1989 Cupo et al. ................ 364/724.16 X
4,931,973 6/1990 Asghar et al. ................... 364/724.16
4,969,191 11/1990 Masson et al. .................... 375/120 X Primary Examiner—Tan V. Mai
Attorney, Agent, or Firm—William E. Hiller; Richard L. Donaldson

[57] ABSTRACT

A transversal filter circuit including a plurality of tap circuits, each having a serial multiplication circuit having a simplified construction and not requiring a shift of decimal (binary) points of data during a partial product calculation and addition operation. The serial multiplier includes a bidirectional shift register for shifting a tap coefficient by a predetermined number of bits in one of two directions, a data input circuit, a partial product calculation circuit, an adding and holding circuit, and a control circuit. The control circuit alternatively changes the shift direction of the bidirectional shift register for shifting a tap coefficient and a data output direction of the data input circuit at each successive cycle. The partial product calculation circuit calculates a partial product of a tap coefficient from the shift register and the input data for a plurality of times defined by a bit number of the input data. The adding and holding circuit adds a newly calculated partial product to a sum of the partial products.

7 Claims, 18 Drawing Sheets

FIG. 12

| OPERATION CYCLE OF PARTIAL PRODUCT | 1 | 2 | 3 | 4 |
|---|---|---|---|---|
| MULTIPLEXER OUTPUT | $Y_{i-1}$ | $Y_i$ | $Y_i$ | $Y_i$ |
| PARTIAL PRODUCT CALCULATION | PARTIAL PRODUCT 1 (pp 1) | PARTIAL PRODUCT 2 (pp 2) | PARTIAL PRODUCT 3 (pp 3) | PARTIAL PRODUCT 4 (pp 4) |
| ADDITION | $Y_{i-1}+pp1$ | $Y_i+pp2$ | $Y_i+pp3$ | $Y_i+pp4$ |
| STATUS HELD IN OUTPUT REGISTER | $Y_i=Y_{i-1}+pp1$ | $Y_i=Y_{i-1}+pp1+pp2$ | $Y_i=Y_{i-1}+pp1+pp2+pp3$ | $Y_i=Y_{i-1}+pp1+pp2+pp3+pp4$ |

FIG. 19 PRIOR ART

```
        1 1 0 1      COEFFICIENT (MULTIPLICAND) =13
    X)  1 0 1 1      INPUT DATA (MULTIPLIER) = 11
        1 1 0 1      PARTIAL PRODUCT 1
    +)  0 0 0 0      SUM OF PARTIAL PRODUCTS 1 1 0 1      PARTIAL PRODUCT 2
    +)  1 1 0 1      PARTIAL PRODUCT 1

0 0 0 0      PARTIAL PRODUCT 3
    +) 1 0 0 1 1 1   PARTIAL PRODUCT 1
                   + PARTIAL PRODUCT 2

1 1 0 1      PARTIAL PRODUCT 4
    +) 1 0 0 1 1 1   SUM OF PARTIAL PRODUCT 1 TO
                     PARTIAL PRODUCT 3

1 0 0 0 1 1 1 1 SUM OF PARTIAL PRODUCT 1 TO
                     PARTIAL PRODUCT 4
```

TRANSVERSAL FILTER CIRCUIT HAVING TAP CIRCUITS INCLUDING BIDIRECTIONAL SHIFT REGISTERS FOR SERIAL MULTIPLICATION

BACKGROUND OF THE INVENTION

1. Field of the Invention

The present invention relates to a transversal filter circuit, more particularly, to a transversal filter circuit having a simplified circuit construction and in which serial binary data are processed.

2. Description of the Prior Art

Transversal filters are employed in various applications, for example, as an echo canceller in a communication system, and as a ghost canceller for an audio signal or a video signal.

Various types of circuit constructions have been proposed for such transversal filter circuits, for example, a transposed transversal shown in FIG. 17 is known. In particular, a time series signal having components which are continued for a long time, such as a video signal is processed by the transposed transversal filter to reduce noise therein.

The transposed transversal filter circuit shown in FIG. 17 includes a plurality of tap circuits (unit elements in the transversal filter circuit) connected in series, each constructed by a multiplier 1 for calculating a product of an input data X and a coefficient Kx, where x=1, 2, . . . , n, an adder 2 for adding the multiplied result and a result obtained at a tap located at a preceding position in a data stream (hereinafter, called a preceding stage), and a unit time delaying circuit 3 for delaying the added result by a unit of time. A filtering processed result Y is finally output from a unit time delaying circuit provided at a final stage tap circuit.

Assuming that such a transversal filter circuit is applied, for example, as a ghost canceller for a video signal, a long time ghost cancellation of the video signal is required, and as a result, a transversal filter including several hundreds of tap circuits must be constructed.

Assuming that such a transversal filter circuit is constructed, it would be mounted in a building block manner in which a plurality of modules of semiconductor (LSI) chips are combined as shown in FIG. 18. In FIG. 18, LSI chips CHIP1 to CHIP5, each of which includes a transversal filter having 128 taps, are serially connected. The first chip CHIP1 includes two sets of FIR transversal filters, each of which has 64 taps and which are used by changing a connection thereat in parallel or in series, and IIR transversal filters, each of which has 128 taps, are constructed to thus connect a total of 512 taps in series.

A video signal 1 is supplied to the first chip CHIP1, an output of the chip CHIP1, as a cascade sum output 1, is supplied to an adder ADR, an output from the final stage chip CHIP5, as a cascade sum output 2, is supplied to the adder, and the added value as a second video signal, is supplied to the chips CHIP1 to CHIP5. On the other hand, a tap coefficient data supplied from outside, and the above video signal, are supplied to the respective chips, and a filtering is processed in accordance with an algorithm on the basis of a construction of the transversal filter circuit shown in FIG. 17.

A fundamental construction of each tap circuit in such multiple stage type transversal filter comprises the multiplier 1, the adder 2 and the unit time delaying circuit 3, specifically a register, described above. When a construction of multiple of taps is adopted, a plurality of tap circuits, each being this type of tap circuit, are connected in series. Now, the fundamental construction of the unit tap circuit will be described.

A multiplication of the tap coefficient and the input data, as shown in FIG. 19, normally, can be serially processed by a plurality of operations, in each of which a partial product is calculated, the resultant partial product is added to a previous sum of partial products obtained until a preceding operation time in consideration of an adjustment of decimal (binary) point positions among the partial products, to adjust the decimal point positions thereof. Under such an algorithm, when the tap coefficient and the input data are both serial binary date, a multiplication of one bit thereof can be carried out using a single AND gate, and thus, the circuit construction of a serial multiplier can be simplified. (If a normal multiplication of the tap coefficient and the input data is carried out, a multiplication circuit having a complex structure is required.) Accordingly, as the multiplier 1, a serial multiplier which consecutively calculates and adds partial products a plurality of times, is provided in each tap.

A parallel multiplication method is also known, but a circuit construction thereof is complex, and further since it is not directly related to the present invention, a description thereof is omitted.

FIGS. 20 and 21 show circuit constructions of prior art serial multiplication circuits.

A serial multiplier shown in FIG. 20 is constructed by connecting a coefficient register 122 holding tap coefficient, an input data register 142 holding an input data and serially outputting same, a partial product calculation circuit 160, a parallel adder 180, an output register 112, and an decimal point position adjustment circuit 900, as shown in the drawing. An operation of this serial multiplier will be briefly described. The partial product calculation circuit 160 calculates a partial product of the tap coefficient output from the coefficient register 122 and one bit data of the input data output from the input data register 142, and the adder 180 adds a current calculated partial product to a sum of a partial products obtained at a preceding timing and held in a holder register 182. The holding register 182 is cleared at a first time of every operation cycle, and is used for temporary storing the result from the adder 180. The decimal point position adjustment circuit 900 is a unidirectional one bit shift register which adjusts a decimal point position of the added result at the preceding timing, to add same to a partial product obtained at a next timing, as shown in FIG. 19.

In the example shown in FIG. 19, partial product calculations are carried out four times in every operation cycle. Hereinafter, this cycle for obtaining the partial products is called a partial product calculation cycle. In this example, therefore, one operation cycle consists of four partial product calculation cycles.

The serial multiplier shown in FIG. 21 is also constructed by connecting a coefficient register 122, an input data register 142, a partial product calculation circuit 160, a decimal point position adjustment circuit 902, a parallel adder 110, and a holding register 182, as shown in the drawing. The shift multiplier carries out a multiplication calculation in accordance with the algorithm shown in FIG. 19, and a result thereof is similar to that obtained by the serial multiplier shown in FIG. 20.

A difference in the circuit construction of the serial multiplier shown in FIG. 20 and the serial multiplier shown in FIG. 21 is a position at which the decimal point position adjustment circuits 900 and 902 are located. In the former, the decimal point position adjustment circuit 900 is located at a position following by the adder 180 or at a position preceding the adder 180, but in the latter case, the decimal point position adjustment circuit 902 is provided between the partial product calculation circuit 160 and the adder 180.

Such serial multipliers suffer from the following disadvantages.

In the serial multiplier shown in FIG. 20, since a decimal point position varies during the calculation, if a result obtained by the serial multiplier is output to a next stage tap circuit, an adjustment of decimal point positions of data in adjacent tap circuits is required, to thereby adjust a difference between decimal points of the data in these tap circuits. In particular, if the output register is employed as an accumulator, the above difference becomes a serious disadvantage. As a result, the multiplier has a disadvantage of a complex circuit construction of a whole transversal filter due to the provision of decimal point position adjustment circuits for adjusting decimal point positions among the data in the tap circuits.

On the other hand, in the serial multiplier shown in FIG. 21, the problem of the above adjustment of the decimal point positions among the data in the tap circuits does not arise, since the adjustment of the decimal point positions is carried out therein, but complex circuits, such as barrel shifters must be employed as the decimal point position adjustment circuit 90, and as a result, the total circuit construction of the serial multiplier becomes complex. Consequently, the total construction of the transversal filter becomes complex, and thus such serial multiplier can not be practically employed.

In sum, when both of the serial multipliers are built into the LSI chip as shown in FIG. 18, a problem arises in that a size of one chip becomes large or the number of taps accommodated in one chip is reduced. The problem in question becomes particularly serious when a transversal filter circuit having several hundreds of taps is required.

The serial multipliers are not limited to application to the transversal filters, and thus, in case where many serial multipliers are used, the problems similar to the above problems may occur.

Next, a prior art circuit construction of one tap circuit shown in FIG. 17 and consisting of a multiplier 1, an adder (accumulator) 2, and a unit time delaying circuit 3, is shown in FIG. 22. Each tap circuit includes the serial multiplier shown in FIG. 20, and further, includes an adder 200, corresponding to the adder 2 shown in FIG. 17, and adding a result $Y_{i-1}$ obtained at a preceding stage and a serial operation result C obtained at a tap circuit itself, and an output register 300, corresponding to the unit time delaying circuit 3 shown in FIG. 17, for holding the added result for a unit time and then outputting same to a next tap circuit.

The serial multiplier shown in FIG. 20 can be replaced by the serial multiplier shown in FIG. 21.

Considering the circuit construction of one tap circuit shown in FIG. 22, this circuit construction appears to be redundant due to a simple combination of the serial multiplier, the adder and the unit time delaying circuit, in addition to the above problem concerning the serial multiplier. Accordingly, a problem arises of a complex circuit construction of one tap circuit and of the total transversal filter circuit.

In the above circuit constructions, although a control circuit for driving and controlling these circuits is not shown, a clock used for driving these circuits can be an internal clock CLKi generated on the basis of an external clock CLKe having, for example, a frequency of 15 MHz; a frequency of the internal clock being 60 MHz, i.e., four times of the frequency of the external clock. The internal clock is generated internally, because it is difficult to supply a high frequency clock of 60 MHz from the outside of the chip. When a large number of taps is included in the transversal filter, and a signal processing time is shortened, a drive clock having a higher frequency is required.

As the circuit generating such an internal clock CLKi having a very high frequency, as shown in FIG. 23, a phase locked loop (PLL) circuit consisting of a phase comparator circuit 50, a loop filter 52, and a digital voltage controlled oscillation (VCO) circuit 58, can be employed. The VCO 58 includes a driver circuit 58A consisting of four series-connected current controlled drivers (inverters) controlled by an output of the loop filter 52, and a feed back inverter, and a clock generation circuit 58B generating an internal clock having a frequency which is based on the frequency of an external clock output from the driver circuit, the frequency of the internal clock being four times the frequency of the external clock.

The PLL shown in FIG. 23, however, includes the phase comparison circuit 50 and the loop filter 52 which are formed as analog circuits, and such analog circuits suffer from a problem such as jitter in a high frequency domain. Accordingly, if LSI chips of the transversal filter circuits are tested as devices, an instability in the operation of the analog circuit components may have an adverse effect on the digital circuit portions. A suitable testing means that does not impose such adverse conditions during the test is not known, and therefore a satisfactory test can not be carried out.

Further, the PLL shown in FIG. 23 suffers from the problem that an operation during test is very different from a normal operation, if a duty of the external clock CLKe is not maintained at 50%. This is because, the internal clock is merely generated by using AND gates or inverted AND gates, on the basis of the output signal from the one series-connected pair of current controlled drivers (inverters). The operation will be described in detail with reference to a timing chart shown in FIG. 24. When the output times of Q outputs from the drivers are shifted, a width of an AND logic thereof is directly varied. As a result, the generation timing of four clocks $\phi_1$ to $\phi_4$ of the internal clock CLKi are shifted. Accordingly, the duty of the external clock must be accurately kept at 50%, but, it is difficult to maintain the duty of the external clock having a high frequency of 15 MHz or higher at 50%, and to apply same to the chips.

Considering the above, an object of the present invention is to provide a serial multiplier, per se, and a transversal filter circuit wherein a tap circuit construction is simplified and mounting efficiency is improved when multiple stage transversal filter circuits are installed in a chip, which generates an accurate internal clock, easily eliminates an adverse effect caused by analog circuit elements, and enables a test to be carried out under the same conditions as for a normal operation.

SUMMARY OF THE INVENTION

First, to overcome the above problems with respect to the serial multiplier based upon an adjustment of the decimal point position among data in the tap circuits in the transversal filter, in particular to solve the problem caused by using barrel shifters or the like in the serial multiplier shown in FIG. 21, a serial multiplier according to the present invention is constructed by a bidirectional shift register 12, shown in FIG. 1, as a block diagram.

Namely, this multiplier is constructed by a shift register 12 able to bidirectionally shift a tap coefficient by a predetermined number of bits to adjust a decimal point position of the tap coefficient, an input data outputting circuit 14 holding an input data A and partially outputting the input data A in accordance with a predetermined pattern, for example, outputting one bit data a, a partial product calculation circuit 160 calculating a partial product of the tap coefficient k shifted and output from the bidirectional shift data 12 and the part of the input data a output from the input data outputting circuit 14, an adding and holding circuit 18 sequentially adding the output signal from the partial product calculation circuit and holding same, and a control circuit 10 alternatively switching a shift direction of the bidirectional shift register 12 and a data output direction of the input data outputting circuit 14.

By using the register 12 which is able to bidirectionally shift the tap coefficient by a predetermined number of bits, in each partial product and partial sum calculation phase in one operation cycle, the tap coefficient can be shifted by the predetermined number of bits in one direction, i.e., to the right direction or to the left direction. The shift direction is controlled by a shift direction command signal U/D output from the control circuit 10 at the completion of each operation cycle or at the beginning of each operation cycle. In a previous operation cycle, the tap coefficient is shifted at one end in the bidirectional shift register 12. After the completion of one operation cycle, at a next operation cycle, the timing coefficient is shifted through the bidirectional shift register 12 in an opposite direction. In this manner, by using the bidirectional shift register 12 wherein the direction of shift of the tap coefficient is switched at a changing timing from a current operation cycle to a next operation cycle, and the tap coefficient is shifted by the predetermined number of bits in the partial product cycle, and which has a simple circuit construction, an adjustment of a decimal point position can be processed without a shift of a binary point position, and complex circuits, such as the barrel shifters are not required.

Since the circuit is constructed to consecutively shift the tap coefficient by the predetermined number of bits, the size of a wiring pattern connecting bit processing circuits in the register 12 can be reduced, resulting in an improved mounting efficiency.

The operations of the partial product calculation circuit 16 and the addition and holding circuit 18 are similar to those of the prior art.

Note, a data output pattern output from the input data outputting circuit 14, and an amount of bits shifted in the bidirectional shift register 12 can be defined on the basis of a partial product operation algorithm.

For example, if a normal one dimensional algorithm is applied, the input data outputting circuit 14 is formed by a serial shift register which shifts by one bit at each partial product operation cycle, and the bidirectional shift register 12 shifts by one bit at each partial product operation cycle.

Also, if a Booth algorithm is applied, the input data outputting circuit 14 is formed by a two dimensional array data holding circuit adaptive to a Booth operation and a Booth operation circuit, and the bidirectional shift register shifts by two bits at each partial product operation cycle.

Furthermore, to overcome the above problem of the circuit construction of each tap circuit, in the present invention circuits are constructed to function in common to thereby simplify the circuit construction of one tap circuit.

Namely, as shown in FIG. 2, one tap circuit of a transversal filter is constructed by adding an addition circuit 20, a multiplexer 22, and an output register 30 functioning as a unit time delaying circuit, to the serial multiplier shown in FIG. 1, and consisting of the control circuit 10, the bidirectional shift register 12, and the input data outputting circuit 14.

The multiplexer 22 outputs a result $Y_{i-1}$ calculated at a preceding stage tap circuit to the addition circuit 20, at only a first operation cycle, and at operation cycles subsequent to the first operation cycle, outputs an output signal of the output register 30 to the addition circuit 20. The addition circuit 20 functions as an adder for a serial multiplier, on one hand, and on the other hand, as an adder for adding the result obtained at the preceding stage of tap circuit and a result obtained at a tap circuit itself. Also, the output register 30 functions as a holding circuit in the addition and holding circuit of the serial multiplier, and a unit time delaying element of one tap circuit. The control circuit 10 also controls switching of the output of the multiplexer 22.

According to this circuit construction, since only the multiplexer 22 and the output register 30 are added to the serial multiplier shown in FIG. 1, the circuit construction becomes simpler and the wiring is reduced.

In addition, to enable the output register to carry out a function similar to the above, and to increase the freedom of circuit arrangement, as can be easily understood, by placing the output register 30 between the multiplexer 22 and the addition circuit 20, instead of placing it at the following stage of the addition circuit 20, an effective layout adaptive to a more practical circuit arrangement can be achieved.

Furthermore, to overcome the above problem regarding the phase locked loop circuit (PLL) for generating the internal clock, as set forth above, in accordance with the present invention, as shown in FIG. 3, by providing an analog switching circuit 56 and a digital switching circuit 58, and supplying an external switching control signal to these switching circuits, a test can be carried out while by passing the phase comparison circuit 50 and the loop filter 52. In this case, a synchronization decoding feedback circuit 54 is supplied with an external control voltage.

Moreover, according to the present invention, the digital type synchronization decoding feedback circuit 54 is employed to generate the internal clock at a rising edge or a trailing edge of a timing signal output from a current controlled driver, and as a result, since it is not dependant upon the duty, i.e., does not require an accurate duty of 50% of the external clock, the internal clock CLKi can be generated at an accurate timing.

In addition, to the above, in accordance with the present invention, the serial multiplier and the phase locked clock generation circuit can be provided as single circuits, respectively.

BRIEF DESCRIPTION OF THE DRAWINGS

FIG. 12 is a view showing an operational mode of the tap circuit shown in FIG. 11;

FIG. 19 is a view showing a serial multiplication algorithm to which the present invention is applied;

EXPLANATION OF REFERENCE NUMERALS

Figure 1:
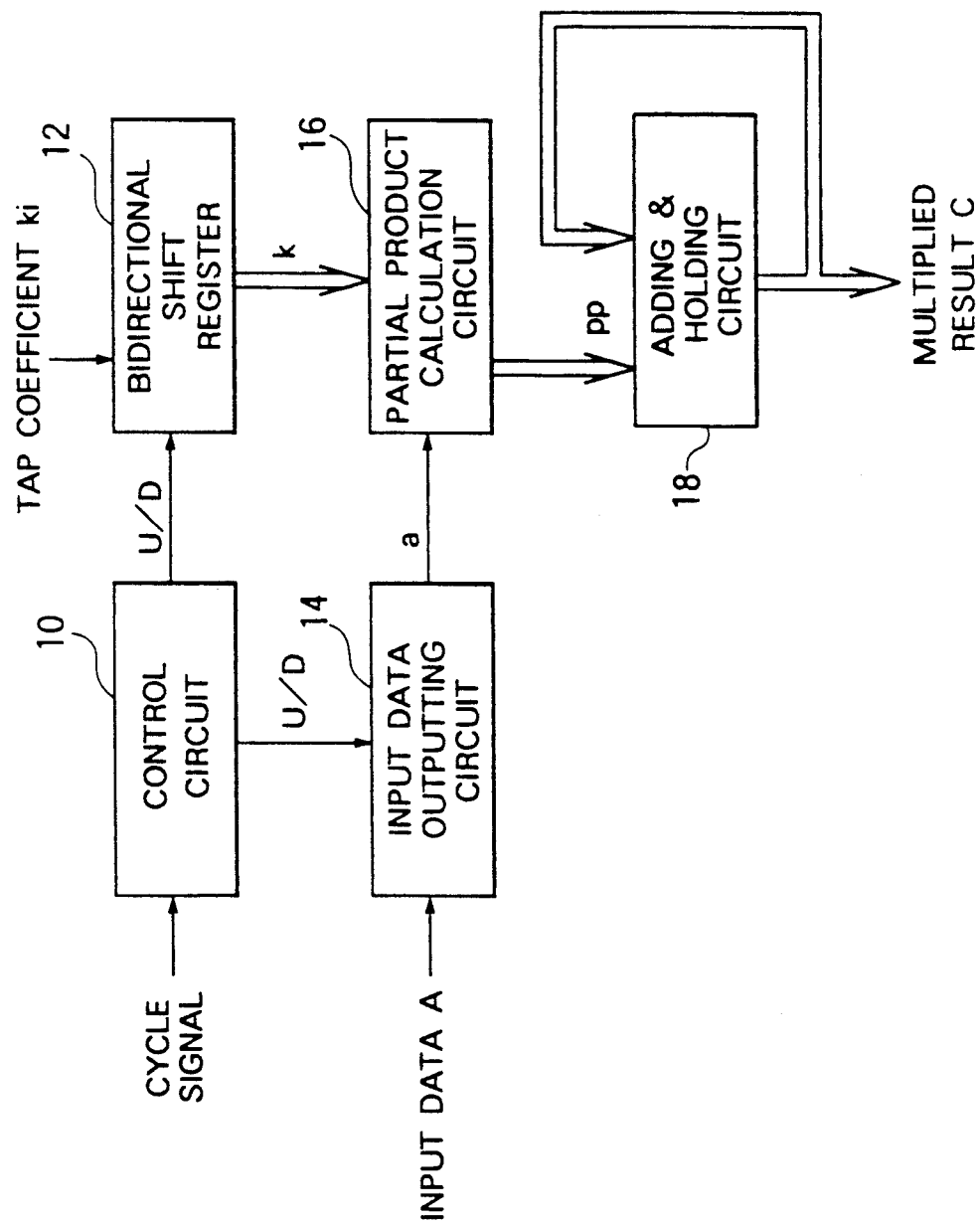
FIG. 1 is a block circuit construction diagram of a serial multiplier employed in each tap circuit of a transversal filter circuit in accordance with the present invention.

10 . . . direction control circuit
12 . . . bidirectional shift register
14 . . . input data outputting circuit
16 . . . partial product calculation circuit
18 . . . addition and holding circuit
20 . . . adder
22 . . . multiplexer
30 . . . output register
50 . . . phase comparison circuit
52 . . . loop filter
54 . . . synchronization decoding feedback circuit
56, 58 . . . switching circuits

DESCRIPTION OF THE PREFERRED EMBODIMENTS

Figure 4:
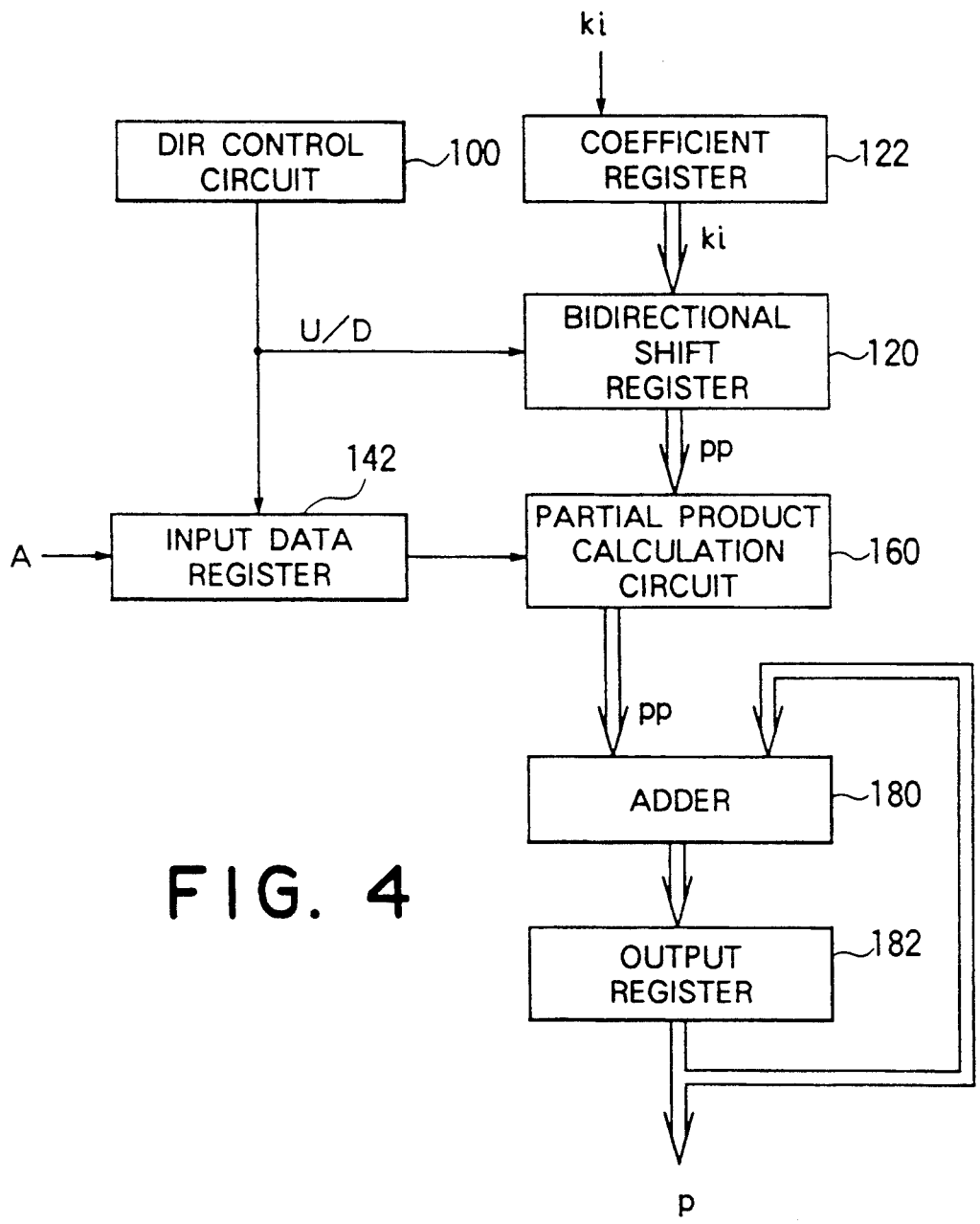
FIG. 4 is a view showing a first circuit example of a serial multiplier of an embodiment in accordance with the present invention.

FIG. 4 is a specific circuit diagram of an embodiment of a serial multiplier in accordance with the present invention as shown in FIG. 1.

The serial multiplier shown in FIG. 4 is a normal serial multiplier in which a Booth algorithm and a Wallace algorithm, described later (see, "Nickei Electronics", Jun. 29, 1978 pp. 76-90) are not employed, and is constructed by connecting a one bit shift type bidirectional shift register 120, a one bit shift type input data register 142, a partial product calculation circuit 160, an adder 180, an output register 182, a shift direction control circuit 100 for designating a shift direction of the bidirectional shift register 120 and the input data register 142, and a coefficient register 122.

The coefficient register 122 is a register that holds a tap coefficient Ki set at an initial operation phase of the serial multiplier, a tap coefficient Ki dynamically set at every operation cycle, or a constant tap coefficient Ki, and outputs a held coefficient to the bidirectional shift register 120. Note, the setting of the tap coefficient to the coefficient register 122 is not a subject of the present invention.

Normally, the tap coefficient has a bit length of 10 bits, and the video signal data (input data) has a bit length of eight bits. However, in this embodiment, as shown in FIG. 19, the tap coefficient and the input data are both four bit binary data, and thus, the coefficient register 122 is a four bit unidirectional shift type serial register.

Figure 5:
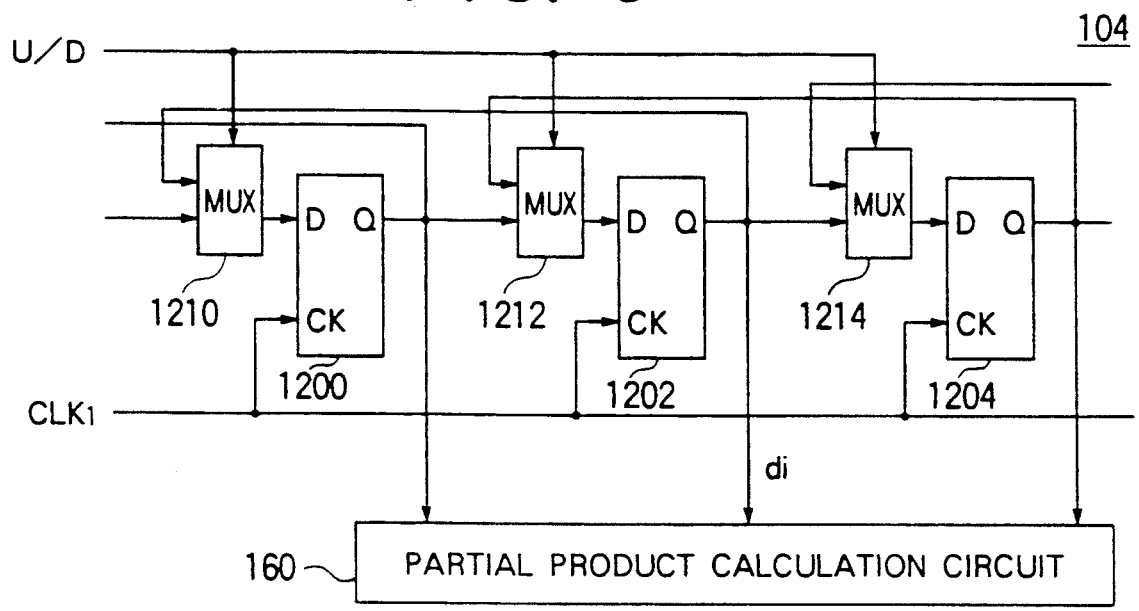
FIG. 5 is a part circuit diagram of a bidirectional shift register employed in a serial multiplier of an embodiment in accordance with the present invention.

FIG. 5 shows a part circuit diagram of the bidirectional shift register 120 which inputs the coefficient from the coefficient register 122, and shifts the input and held tap coefficient by one bit in response to a direction command signal U/D (UP (left direction shift) / DOWN (right direction shift)) from the shift direction control circuit 100. The one bit circuit of this bidirectional shift register 120 consists of a delay type flip-flop (DFF) 1202 and a multiplexer 1212 connected to a delay input terminal (D) thereof. The multiplexer is merely a circuit for selecting two inputs, and thus this multiplexer can be easily constructed using two AND gates. The multiplexer 1212 receives a Q output from a preceding stage DFF 1200 and a Q output from a following stage DFF 1204, and outputs a shift direction to a D terminal of a DFF 202 in response to the direction command U/D output from the shift direction control circuit 100. Clock terminals CK of all of the DFF are supplied with an internal clock CLKi. When the input tap coefficient is shifted to the right, a direction command having a logic "1" is output from the shift direction control circuit 100, and all of the multiplexers 1210 to 1214 output the Q outputs at the preceding stage DFFs to the respective D terminals of the DFFs corresponding to the multipliers; alternatively, the multiplexers output the Q outputs from the following stages DFFs to the respective D terminals of the corresponding DFFs.

Since the bidirectional shift register 120 shifts the tap coefficient by a bit number of the input data − 1, assuming that the bit number of the input data is four, the circuit construction thereof is a seven bit circuit construction.

The input data register 142 is a conventional bidirectional shift register which temporarily holds the input data, and outputs same by sequentially one bit, from the MSB (Most Significant Bit) side or the LSB (Least Significant Bit) side, in response to the direction command from the shift direction control circuit 100. In this embodiment, the input data register is a four bit bidirectional shift register.

The input data register 142 can output a part of an input data A in one direction from the LSB or the MSB by switching an insertion direction of the input data at either the LSB side or the MSB side in response to the direction command U/D from the shift direction control circuit 100. In the following description, however, an example when a partial input data A is output from the LSB or the MSB in response to the direction command U/D will be described.

Figure 6:
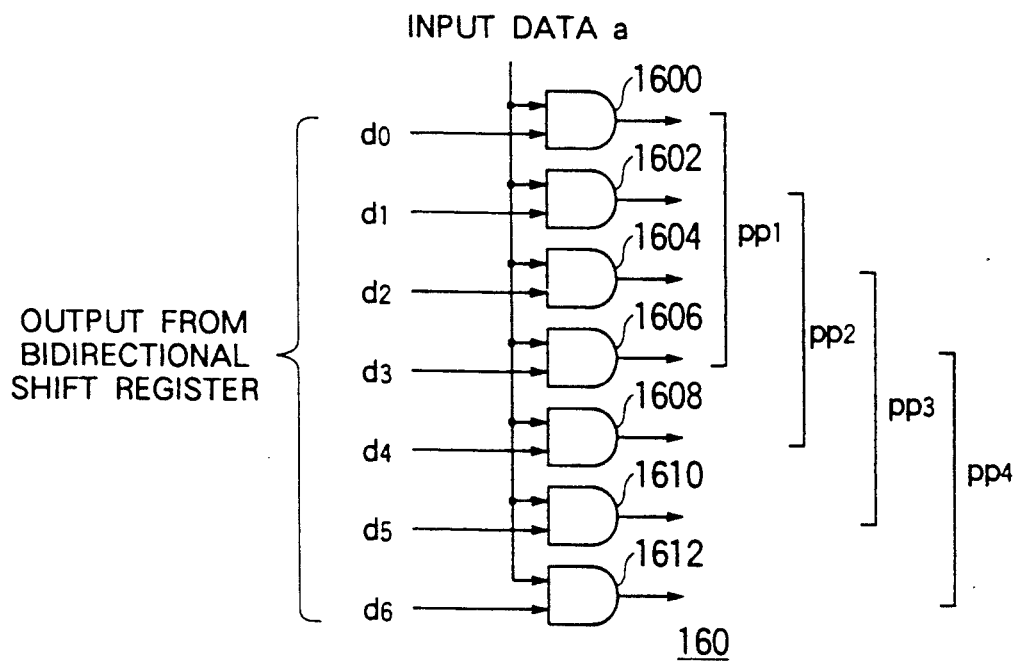
FIG. 6 is a circuit diagram of a partial product calculation circuit employed in a serial multiplier of an embodiment in accordance with the present invention.

FIG. 6 is a circuit diagram of the partial product calculation circuit 160. The partial product calculation circuit 160 is formed by seven parallel arranged AND gates 1600 to 1612. The AND gates are supplied with one bit output data A from the input data register 142, and bit data d0 to d6 corresponding to the tap coefficient from the bidirectional shift register 120, and calculate partial products pp1 to pp4 of the binary data, respectively.

The adder 180 is a seven bit parallel adder. The output register 182 is a seven bit parallel-in and parallel-out type register.

The shift direction control circuit 100 outputs the direction command U/D, the logic of which is alternatively switched between "1" (right direction shift) and "0" (left direction shift), to the bidirectional shift register 120 and the input data register 142. Note, in this example, an output direction of the input data register 142 is the reverse of a shift direction of the bidirectional shift register 120, and accordingly, the logical status of the direction command U/D output to the input data register 142 and the bidirectional shift register 120 is reversed.

Figure 7:
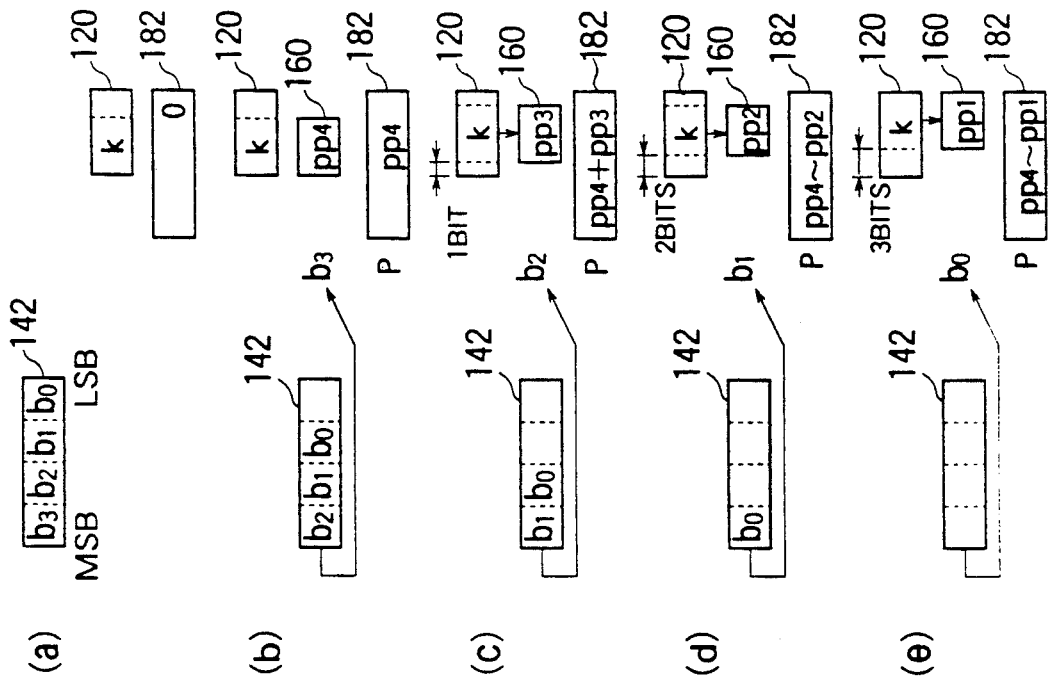
FIGS. 7 and 8 are views showing operation modes of the serial multiplier shown in FIG. 4, respectively.
Figure 8:
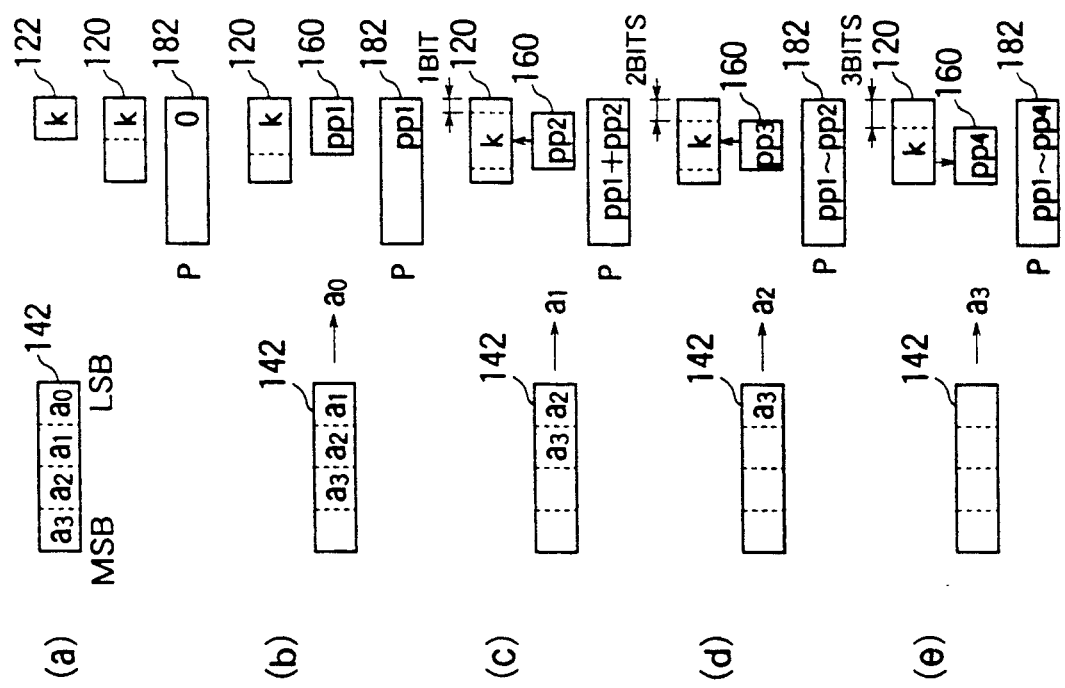

The operation of the serial multiplier shown in FIG. 4 will be described with reference to FIGS. 7 and 8. FIG. 7 shows the operation mode when the operation cycles are odd, and FIG. 8 shows the operation mode when the operation cycles are even.

Referring to FIG. 7, at an initial time of one operation cycle (see FIG. 7a), four bits of input data $a_3$ to $a_0$ (where, $a_3$ indicates the MSB side, and $a_0$ the LSB side) are input to the input data register 142, the tap coefficient K is set to the coefficient register 122, and the output register 182 is cleared at zero. Also, the tap coefficient input to the coefficient register 122 is transferred to the bidirectional shift register 120.

At a first partial product calculation cycle (see FIG. 7b), the LSB: $a_0$ of the input data is output to the partial product calculation circuit 160, from the input data register 142, and a partial product $pp1 = K \cdot a_0$, which is a partial product of the output data and the tap coefficient K output from the bidirectional shift register 120, is obtained at the partial product calculation circuit 160. The partial product pp1 is added to a value of the output register 182 (which is cleared at zero at the initial phase) in the adder 180, and stored in the output register 182.

At a second partial product calculation cycle (see FIG. 7b), the tap coefficient k in the bidirectional shift register 120 is shifted to the left by one bit. Also, a next bit data $a_1$ of the input data is output from the input data register 142, a partial product $pp2 = K \cdot a_1$ which is an adjusted decimal point position of this bit data $a_1$ is calculated at the partial product calculation circuit 160, a sum of the output of the output register 182 holding the previous partial product pp1 and the current partial product pp2 is obtained at the adder 180, and the obtained sum is again stored in the output register 182.

In third and fourth partial product calculation cycles, a similar processing can be carried out, and the decimal point position adjusted summation of the partial products pp1 to pp4, i.e.; a serial multiplied result P, is obtained at the output register 182.

As seen from the above operation, the tap coefficient k is shifted to the left by one bit at every partial product calculation cycle, and is shifted to the left end of the bidirectional shift register 120 at a final partial product calculation cycle.

When a next even operation cycle is reached, as shown in FIG. 8, at an initial phase (see FIG. 8a) as described above, new input data $b_3$ to $b_0$ are input to the input data register 142, and the output register 182 is cleared.

In this example, it is assumed that the tap coefficient k is not dynamically varied at every operation cycle, and the coefficient register 122 is not set by a new tap coefficient. Note, if an update of the tap coefficient is required at every operation cycle, the coefficient register 122 is removed and the tap coefficient is directly input to the bidirectional shift register 120. In this case, the tap coefficient is input to the LSB side or the MSB side of the bidirectional shift register 120 according to whether the operation cycle is odd or even, i.e., in response to the direction command U/D from the shift direction control circuit 100.

At a first partial product operation cycle (see FIG. 8b), the MSB; $b_3$ of the input data is output to the partial product calculation circuit 160 from the input data register 142, and a partial product $pp4 = k \cdot b_3$ of same and the tap coefficient k output from the bidirectional shift register 120 is calculated in the partial product calculation circuit 160. The partial product pp4 is added to the output of the output register 182, and the added result is stored in the output register 182.

For the operation cycles following to the second operation cycle, the operation is similar to that shown in FIG. 7, except that the tap coefficient k is shifted by one bit to the right in the bidirectional shift register 120, and the data output from the input data register 142 is output from the MSB side to carry out a sequential calculation from a high order partial product to a low order partial product, and to obtain a sum of a current value and a previous value.

At the completion time of the odd operation cycle, the tap coefficient is placed at the right end shift position of the bidirectional shift register 120, as shown in FIG. 7b. Accordingly, the next odd operation can be carried out as above, in accordance with the mode shown in FIG. 7. Even operations can be carried out in the same way as described.

As described above, the shift direction of the tap coefficient is determined to be to the right or to the left, alternatively at the time of the switching of the calculation cycle, and the tap coefficient is shifted by one bit at every partial product calculation cycle. Also, the data output direction of the input data register 142 is determined to be to the MSB side or the LSB side, alternatively, at the time of switching of the calculation cycle, and the data is output by one bit in accordance with the determined direction at every partial product calculation cycle. According t this operation, the serial multiplier outputs the serial multiplied result in which the decimal point position has not been shifted.

Accordingly, when a plurality of serial multipliers are cooperatively operated, a shift of the decimal point positions among the serial multipliers does not occur, and thus the circuit construction becomes simple. In particular, since the bidirectional shift register 120 is merely a one bit bidirectional shift register, when the circuits are formed as a semiconductor chip circuit, the wiring is reduced.

A Booth algorithm, a Wallace algorithm, etc., which are intended to process a signal at high speed, are known as parallel operation algorithms, in addition to the above normal algorithm, and it is obvious that a multiplication in accordance with these algorithms can be applied to the present invention.

Figure 9:
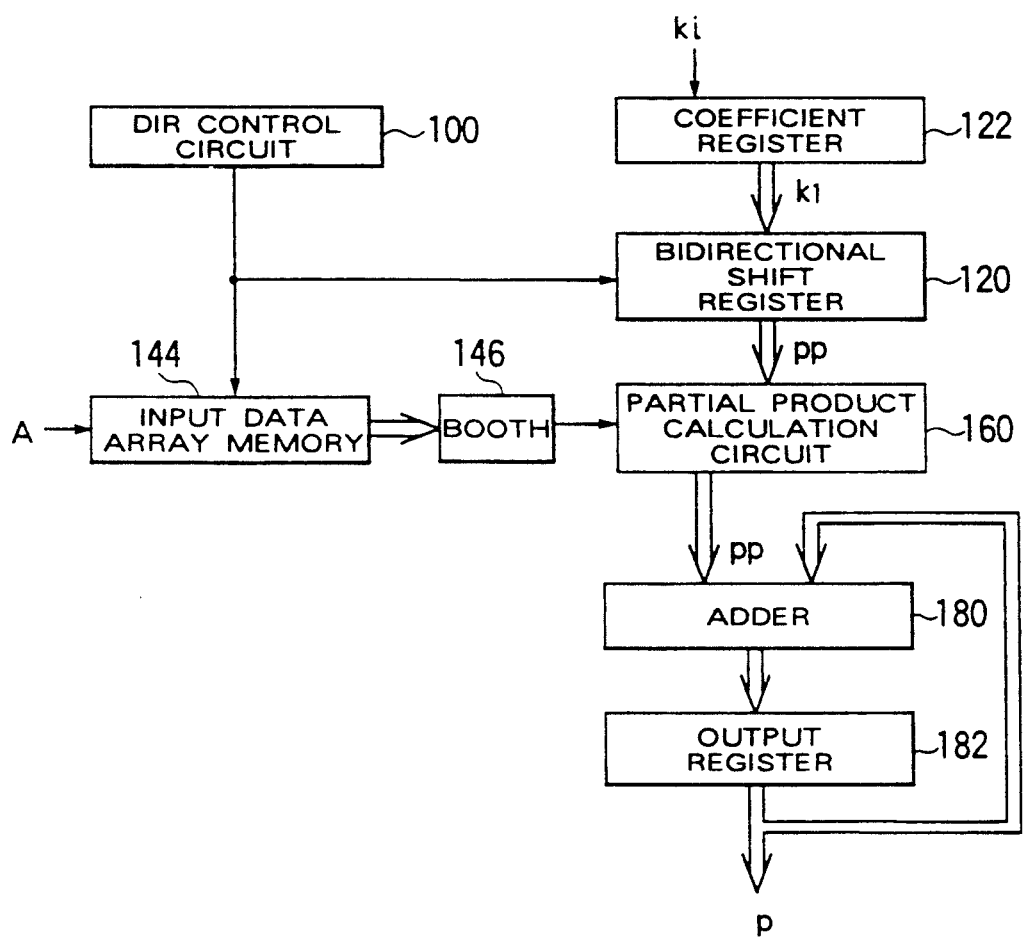
FIG. 9 is a circuit diagram of a second embodiment of a serial multiplier in accordance with the present invention.

FIG. 9 shows a circuit diagram of an embodiment of a serial multiplier to which the Booth algorithm is applied. The Booth type serial multiplier is provided with a two-dimensional input data array memory 144, and a Booth circuit 146 which outputs the signal output from the array memory to the partial product calculation circuit 160 in accordance with the Booth algorithm (see "Nikkei Electronics" described above), instead of the one dimensional input data outputting register 142 in the serial multiplier shown in FIG. 4.

Figure 10:
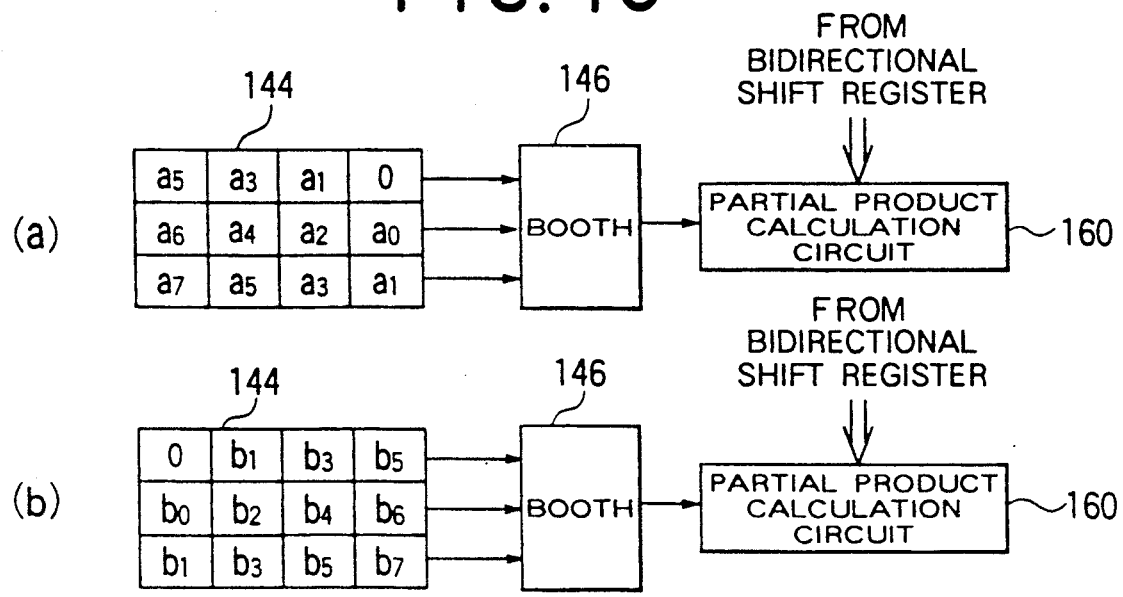
FIG. 10 is a view showing an output form of an input data of the serial multiplier shown in FIG. 9.

When the calculation cycles are odd, an arrangement of input data a0 to a7 in the input data array memory 144 and an output mode to the Booth circuit 146 is as shown in FIG. 10a, and when the calculation cycles are even, an arrangement of input data b0 to b7 in the input data array memory 144 and an output mode to the Booth circuit 146 is as shown in FIG. 10b.

Note, when the Booth algorithm is applied, a bit shift of the bidirectional shift register 120 at one partial product calculation cycle becomes two bits instead of the one bit set forth above.

The Wallace algorithm can be applied in the same way as the Booth algorithm, and therefore, a description thereof is omitted.

Next, a circuit of one tap in a transversal filter circuit of an embodiment in accordance with the present invention will be described with reference to FIG. 11.

Figure 2:
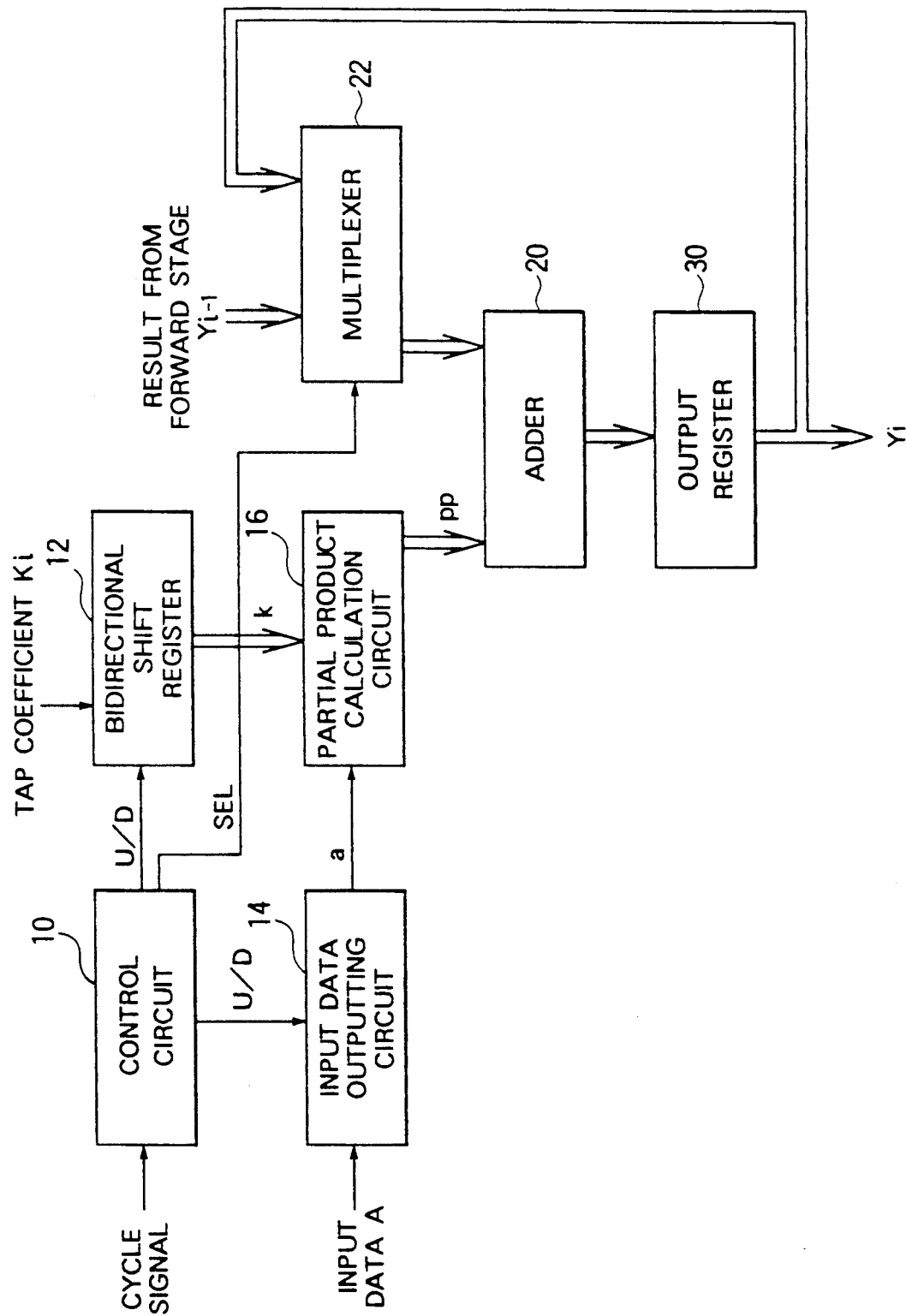
FIG. 2 is a block circuit construction diagram of one tap circuit of a transversal filter circuit in accordance with the present invention.
Figure 11:
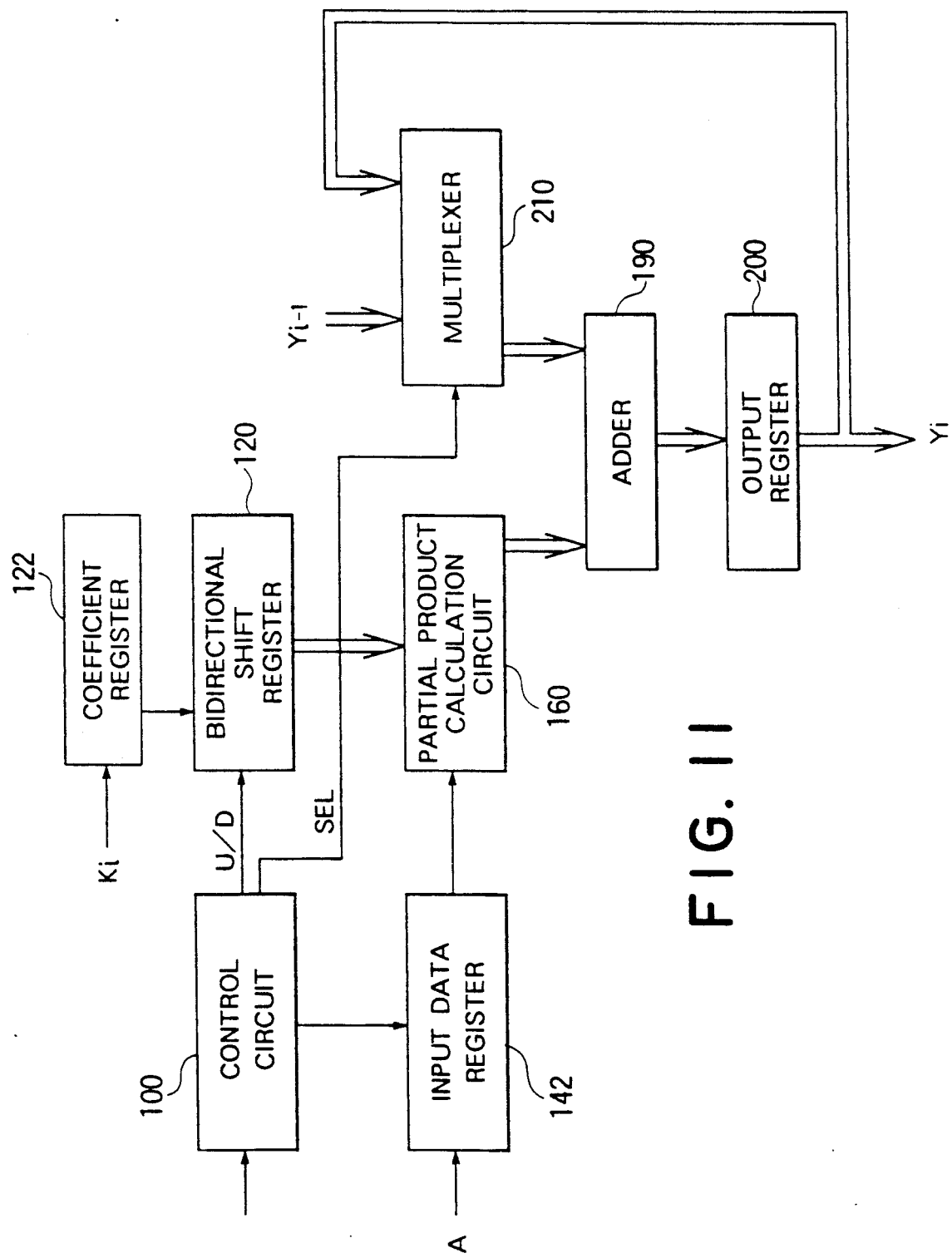
FIG. 11 is a circuit construction diagram of one tap circuit in a transversal filter of an embodiment in accordance with the present invention.
Figure 17:
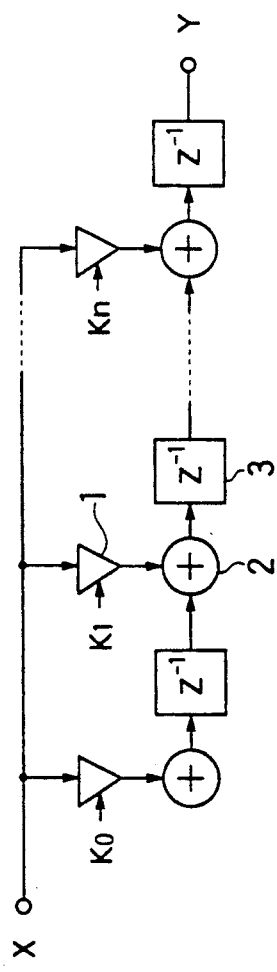
FIG. 17 is a view of a construction transversal filter to which the present invention is applied.
Figure 18:
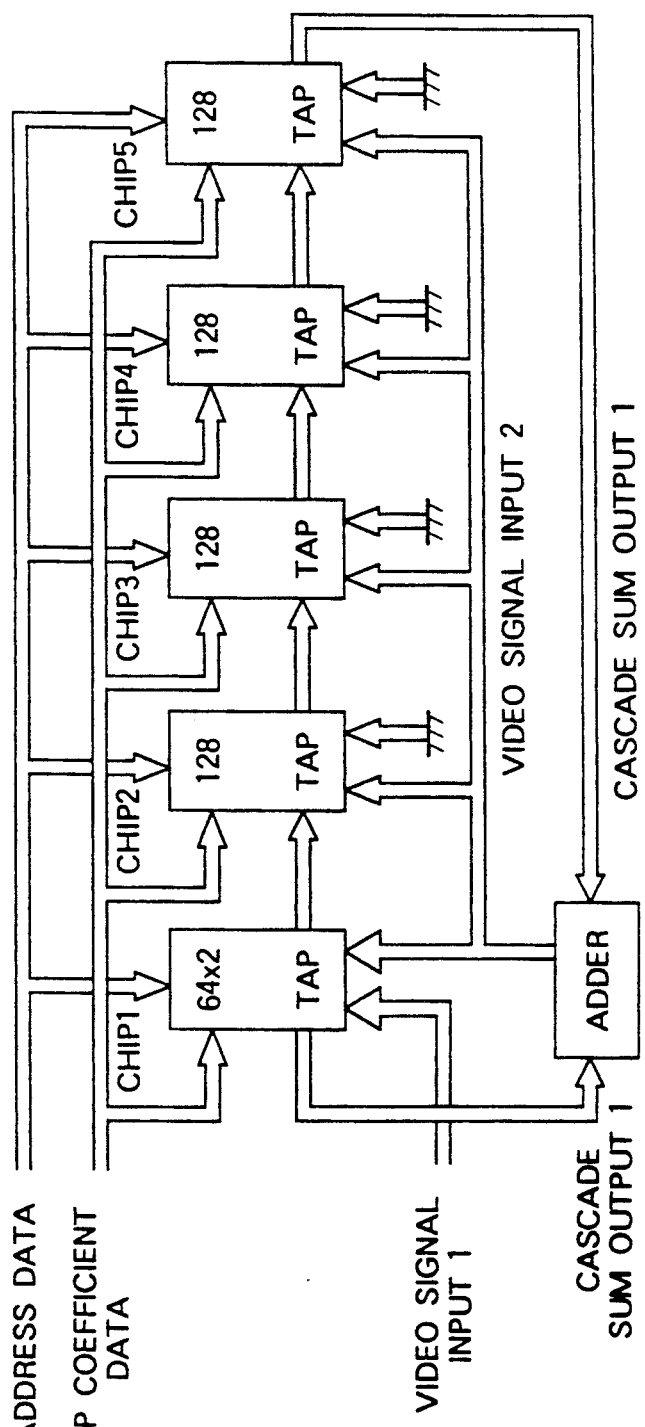
FIG. 18 is a view showing an example of a construction of the transversal filter shown in FIG. 17.
Figure 21:
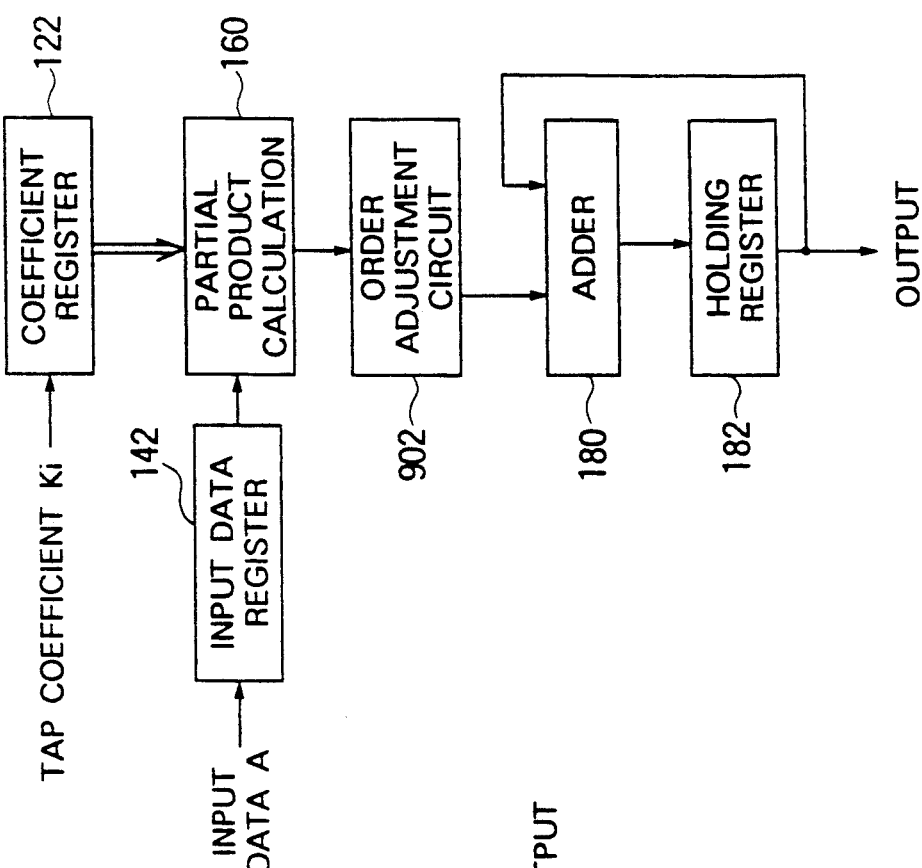
FIGS. 20 and 21 are circuit diagrams of prior art serial multipliers, respectively.
Figure 20:
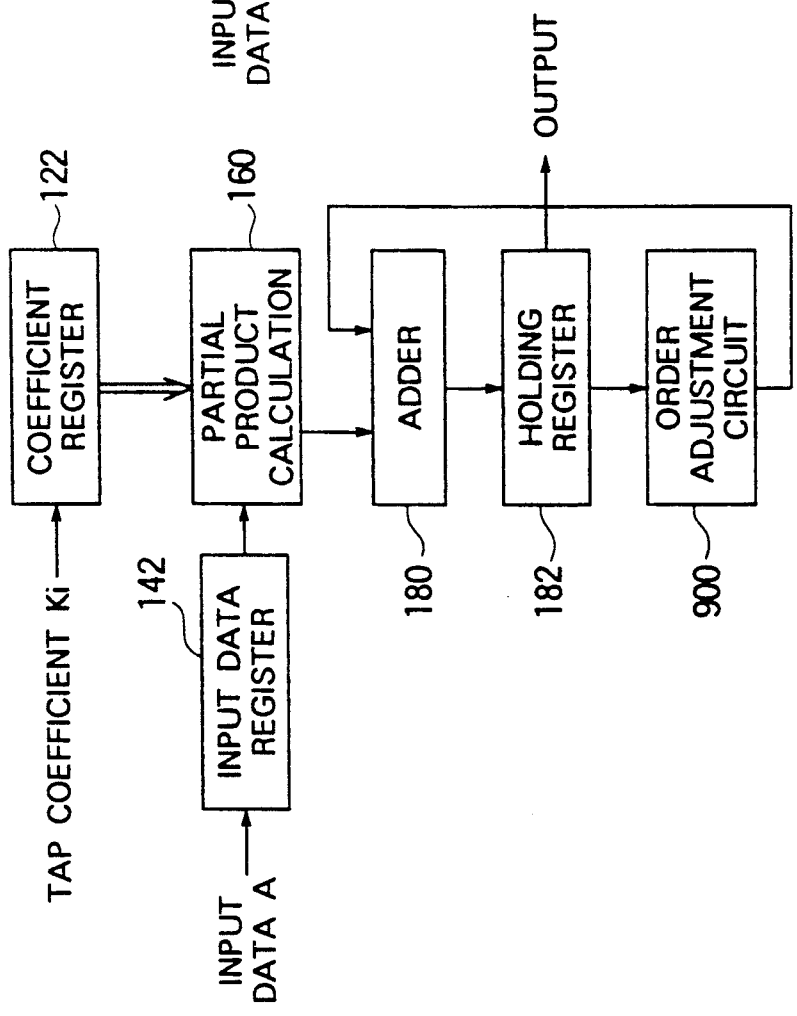
Figure 22:
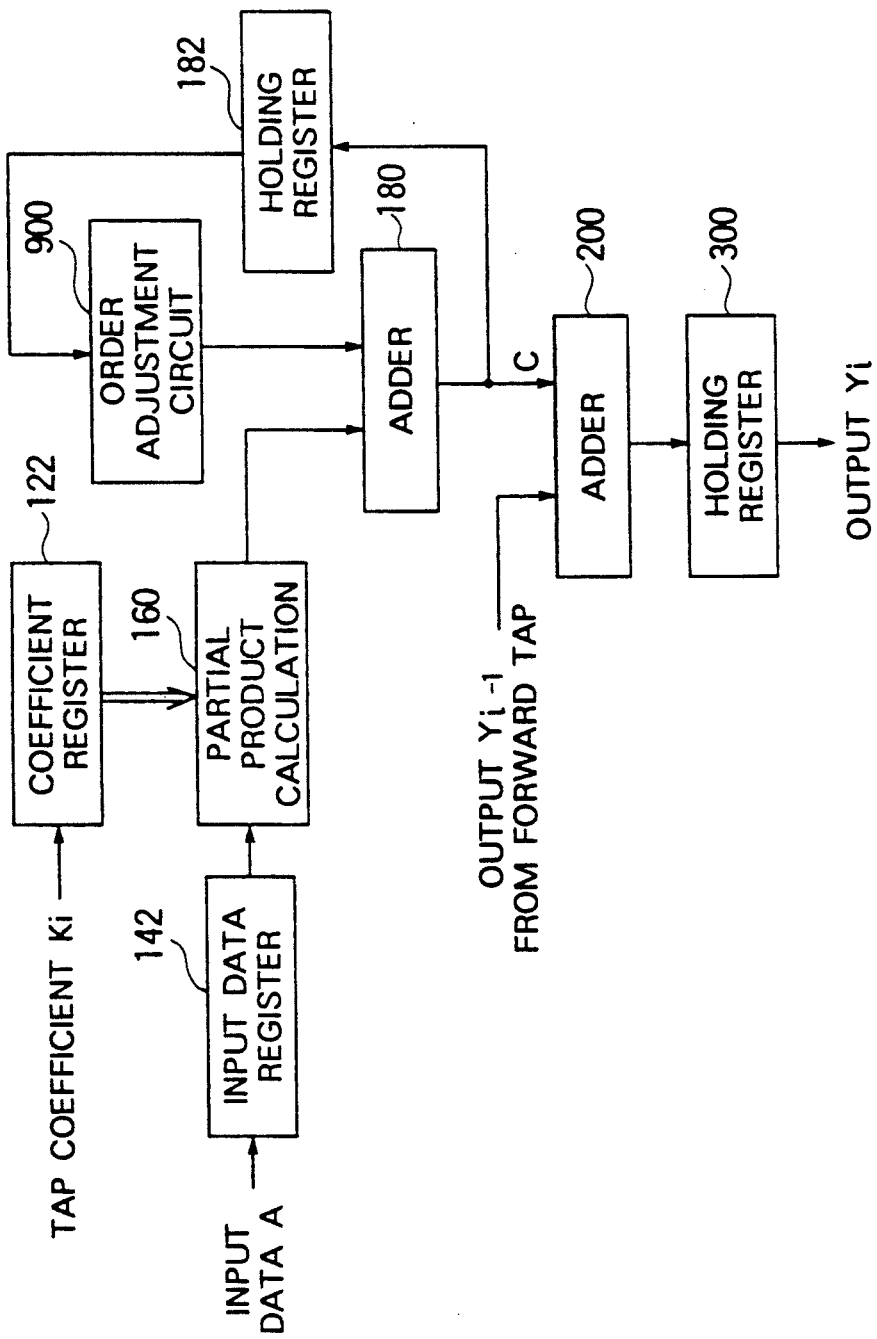
FIG. 22 is a circuit diagram of one tap circuit of a prior art transversal filter.
Figure 23:
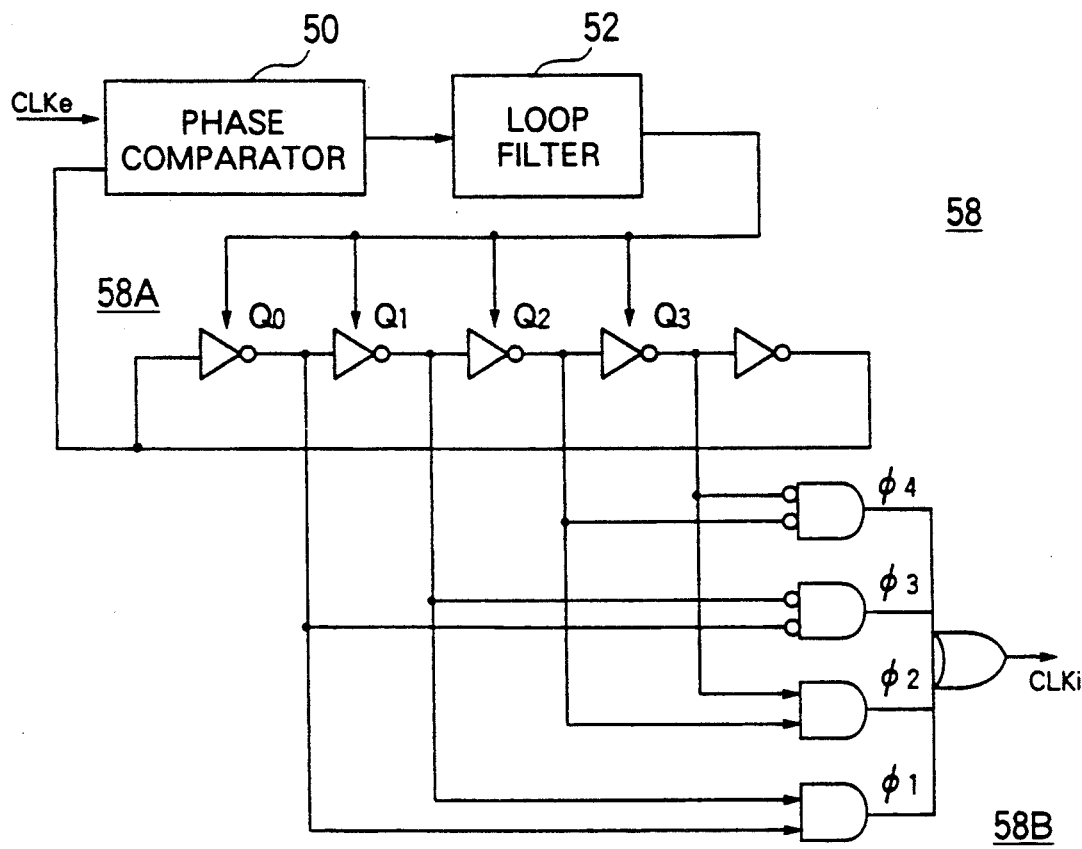
FIG. 23 is a circuit diagram of a prior art internal clock generation circuit.
Figure 24:
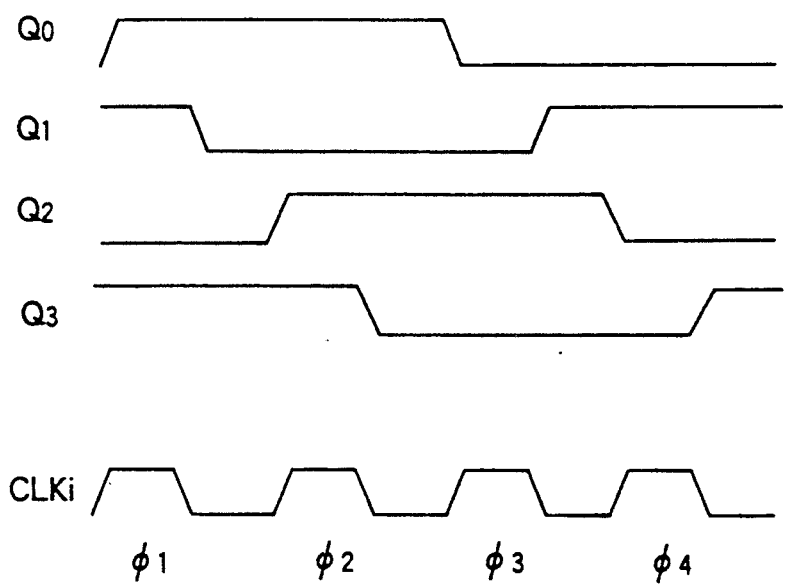
FIG. 24 is a timing chart explaining the operation of the circuit shown in FIG. 23.

The one tap circuit of the transversal filter circuit shown in FIG. 11 uses the serial multiplier set forth above. However, as shown in FIG. 2, an adder (the adder 2 of FIG. 17) for adding the multiplied result of the serial multiplier and result calculated at a preceding stage, and an output register (the unit time delaying circuit 3 of FIG. 17) used as a unit time delaying element, are used as a part circuit of the serial multiplier described above, simplifying the one tap circuit construction of the transversal filter.

Namely, the one tap circuit of the transversal filter shown in FIG. 11 is comprised of an adder 190 commonly used as the adder 180 in the serial multiplier and an adder for one tap, an output register 200 used as the output register 182 in the serial multiplier and an output register as a unit time delaying element for one tap, and a multiplexer 210 switching a result $Y_{i-1}$ obtained at the preceding tap circuit and a result Yi obtained at a tap circuit itself, in addition to the shift direction control circuit 100, the input data register 142, the coefficient register 122, the bidirectional shift register 120, and the partial product calculation circuit 160, which form the serial multiplier shown in FIG. 4. Note, in order to selectively output the result $Y_{i-1}$ from the preceding tap circuit to the adder through the multiplexer 210 at a timing at which the input data is input to the input data register 142, the shift direction control circuit 100 outputs a selection command SEL (logic level "1") to the multiplexer 210. At partial product calculation cycles following this cycle, the logic level of the selection command from the shift direction control circuit 100 becomes "0", and the data output from the output register 200 is supplied to the adder 190 through the multiplexer 210.

FIG. 12 shows an operation mode of the above mentioned one tap circuit shown in FIG. 11. At a first partial product calculation cycle in one operation cycle, the result $Y_{i-1}$ of the preceding tap circuit is output to the adder 190 from the multiplexer 210 and is added to a first partial product pp1 from the partial product calculation circuit 160, and the resultant sum is held at the output register 200. At partial product calculation cycles following the first partial product calculation cycle, the result held in the output register 200 is supplied to the adder 190 through the multiplexer 210, to be consecutively added to second to fourth partial products pp2 to pp4, and to be held in the output register 200.

As seen from the above, the adder 190 functions as both the adder in the serial multiplier and the independent adder in the one tap circuit, and the output register 200 delays the summation of the result of the preceding tap circuit and the multiplied result in the self tap circuit by one operation cycle.

Figure 13:
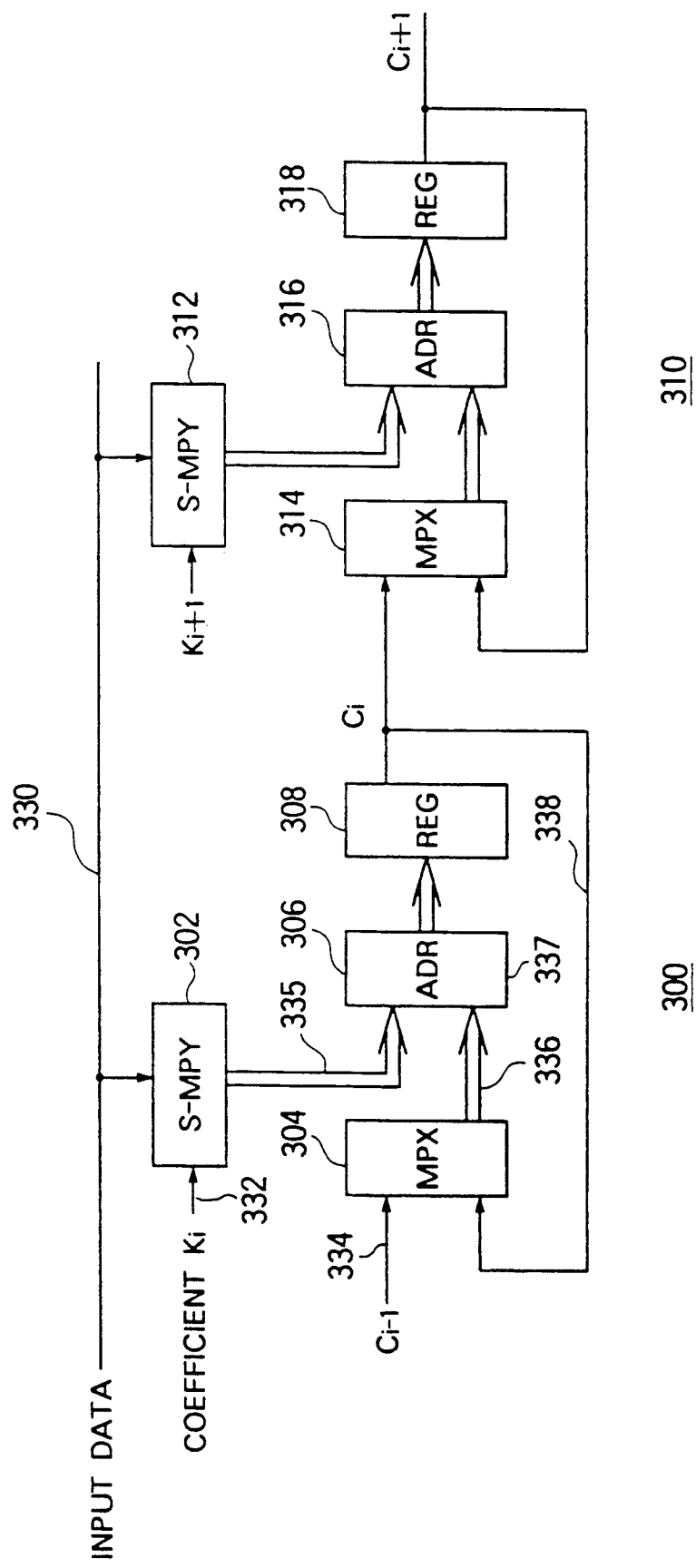
FIG. 13 is a view of an arrangement whereby the tap circuit shown in FIG. 11 is mounted on a semiconductor chip.

FIG. 13 shows a layout when the one tap circuit shown in FIG. 11 is mounted on a semiconductor chip. The one tap circuit 300 is comprised of a block 302 consisting of the shift direction control circuit 100 in the serial multiplier, the input data register 142, the coefficient register 122, the bidirectional shift register 120, and the partial product calculation circuit 160, a block 304 of the multiplexer 210, a block 306 of the adder 190, and a block 308 of the output register 200. Regarding the wiring 330 to 338 shown in the drawing, double lines show parallel wiring, and single lines show serial wiring. In this circuit layout, each block is placed along the data processing flow. Accordingly, except for a serial line wiring 338 returning from the output register block 308 to the multiplexer block 304, signal line wiring 334 to 337 among the blocks, an input data line wiring 330 and a coefficient wiring 332 are arranged along the data flow, and thus there is no wastage of the wiring pattern. Consequently, a simple circuit construction is achieved for the mounting, and thus this simplification of the circuit construction greatly improves the mounting efficiency. As a result, the number of taps that can be accommodated in one LSI chip is increased, or the size of the LSI can be reduce.

As shown in FIG. 11, an example wherein the serial multiplier shown in FIG. 4 is used as the serial multiplier used in the tap circuit, is described, and when the Booth algorithm multiplier as shown in FIG. 9 and other serial multipliers can be applied thereto, effects similar to the above can be obtained.

Figure 3:
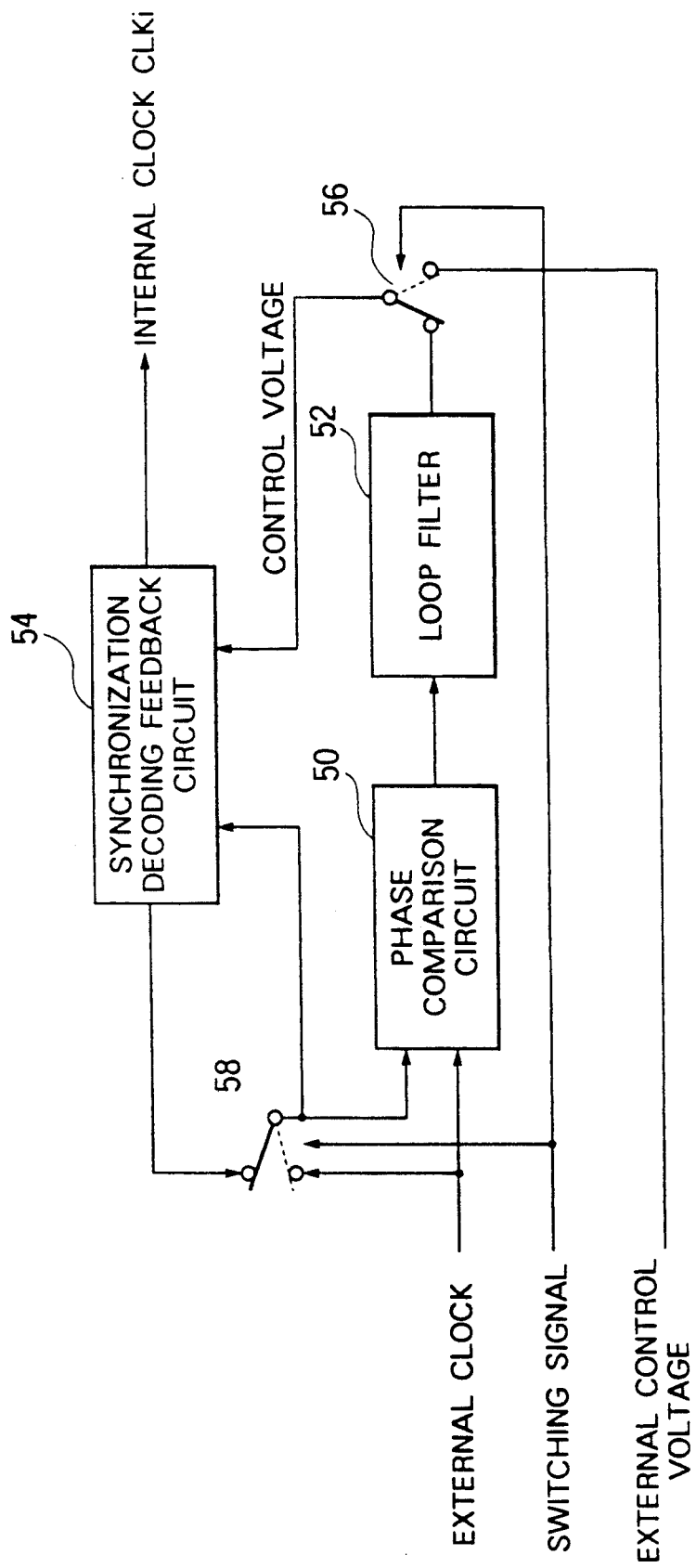
FIG. 3 is a block circuit construction diagram of an internal clock generation circuit in accordance with the present invention.

Further, a PLL type internal clock generation circuit of an embodiment in accordance with the present invention will be described with reference to FIG. 14. This circuit shows an embodiment of the synchronization decoding feedback circuit 54 functioning as the digital voltage controlled oscillation circuit (VCO), and the switching circuit 58, in the internal clock generation circuit shown in FIG. 3. The phase comparison circuit 50, and the low pass filter (loop filter) 52 are similar to those of the prior art, and thus, a description thereof is omitted. Also, the analog switching circuit 56, per se, is well known, and thus a description thereof is omitted.

Figure 14:
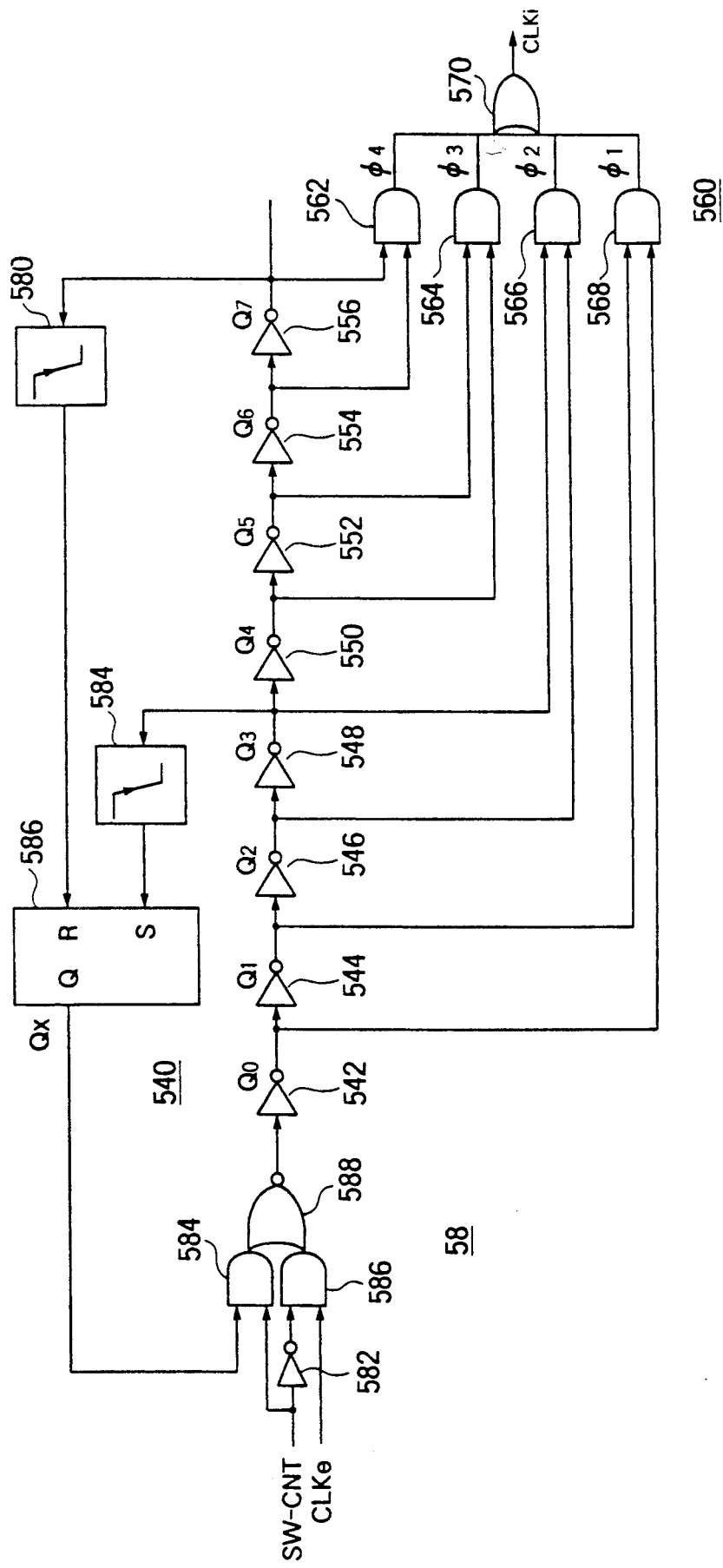
FIG. 14 is a circuit diagram of a synchronization decoding feedback circuit of an internal clock generation circuit of an embodiment in accordance with the present invention.

In FIG. 14, the switching circuit 58 consists of an inverter 582, an AND gate 584, and a NOR gate 588. When a switching control signal SW-CNT having a high level (logic "1") is supplied externally of the semiconductor chip on which the transversal filter circuit is mounted, a Q output of a set-reset type flip-flop (R-FF) 586 is output from the NOR gate 588. Alternatively, when the switching control signal SW-CNT having a low level (logic "0") is supplied, an external clock CLKe supplied externally of the semiconductor chip on which the transversal filter is mounted is output from the NOR gate 588. Namely, by changing only the logic of the switching control signal SW-CNT supplied continually, either a normal output from the synchronization decoding feedback circuit or the external clock CLKi can be selected as an input signal of the phase comparison circuit 50. Note, when the external clock CLKe is supplied to the phase comparison circuit 50, simultaneously a control voltage is supplied externally of the semiconductor chip on which the transversal filter circuit is mounted, to a current drive type driver circuit described later, through the switching circuit 56, instead of the output from the loop filter 52. As a result, by a feedback of the external clock CLKe as the comparison signal of the phase comparison circuit 50, i.e., under a no phase difference condition, a generation of the internal clock CLKi can be tested in accordance with an external control voltage, under a driven condition of the current drive type driver circuit.

The synchronization decoding feedback circuit 54 is comprised of a current controlled driver circuit 540, an internal clock generation circuit 560, pulse trailing edge detecting circuits 580 and 584, and an R-SFF 586. The current controlled driver circuit 540 comprises of eight series-connected current controlled drivers (inverters) 542 to 556. These drivers are supplied with a control voltage from the loop filter 52 (FIG. 3), i.e., a control voltage corresponding to the phase difference detected at the phase comparison circuit 50. The internal clock generation circuit 560 consists of four parallel-connected AND gates 562, 564, 566, and 568 and an OR gate 570 for calculating a logic sum of the outputs from these AND gates. The AND gates 562 to 568 are supplied with outputs of a pair of series-connected drivers 554 and 556 to a pair of series-connected drivers 542 and 544. The pulse trailing edge detecting circuits 580 and 584 detect trailing edges of pulses from the drivers 548 and 556, and supply detected signals to a reset terminal R and a set terminal S of the R-SFF 586, respectively.

Figure 15:
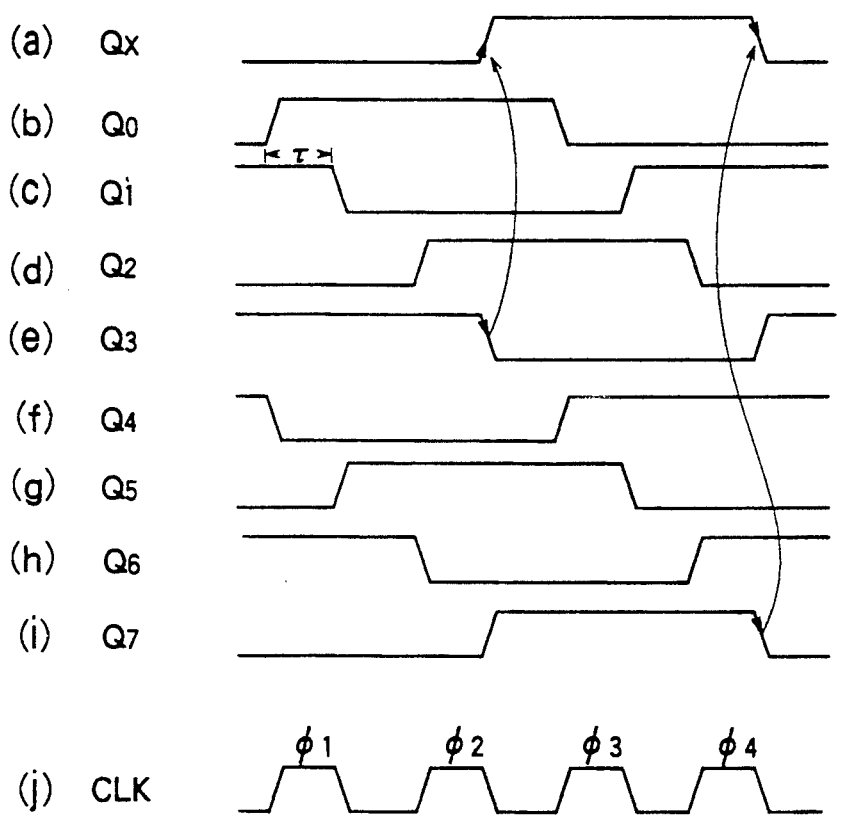
FIG. 15 is a timing chart explaining the operation of the circuit shown in FIG. 14.

Referring to FIG. 15, in a normal operation mode, i.e., when the Q output of the R-SFF 586 in the switching circuit 58 is supplied to the current drive-type driver circuit 540, the generation of the internal clock CLKi in the synchronization decoding feedback circuit 54 shown in FIG. 14 will be described.

The series-connected drivers 542 to 556 reverse the outputs of the preceding drivers, respectively, and delay a time T defined by the output of the loop filter 52 (FIGS. 15b to 15i). Accordingly, the outputs from the adjacent drivers, for example, the outputs $Q_0$ and $Q_1$, are made a logical AND by the AND gate 568 when both outputs are logical "1", and a first phase of clock $100_1$ of the internal clock CLKi is obtained (FIG. 15j). The generation of other clocks $\phi_2$ to $\phi_4$ is similar to that set forth above. As a result, the internal clock CLKi having a frequency which is four times the frequency of the external clock CLKe, is output. Note, the above operation is identical to that disclosed in the prior art.

In the embodiment of the present invention, further, the pulse trailing edge detecting circuits 580 and 584 detect the output $Q_3$ of the driver at a middle stage and the output Q− of the driver at a final stage, to reset or set the R-SFF 586 at a pulse trailing timing, so that a timing shift due to a variation caused by jitter or the like in a system of the phase comparison circuit 50 and the loop filter 52, is adjusted, and a timing shift of the driver output is adjusted, and as a result, the clocks $\phi_1$ to $\phi_4$ of the internal clock CLKi are stably generated at a phase which does not strongly depend upon the duty of the external clock CLKe.

As a result, the signal processing of the transversal filter circuit, wherein the internal clock CLKi is used, is carried out at a correct timing.

Figure 16:
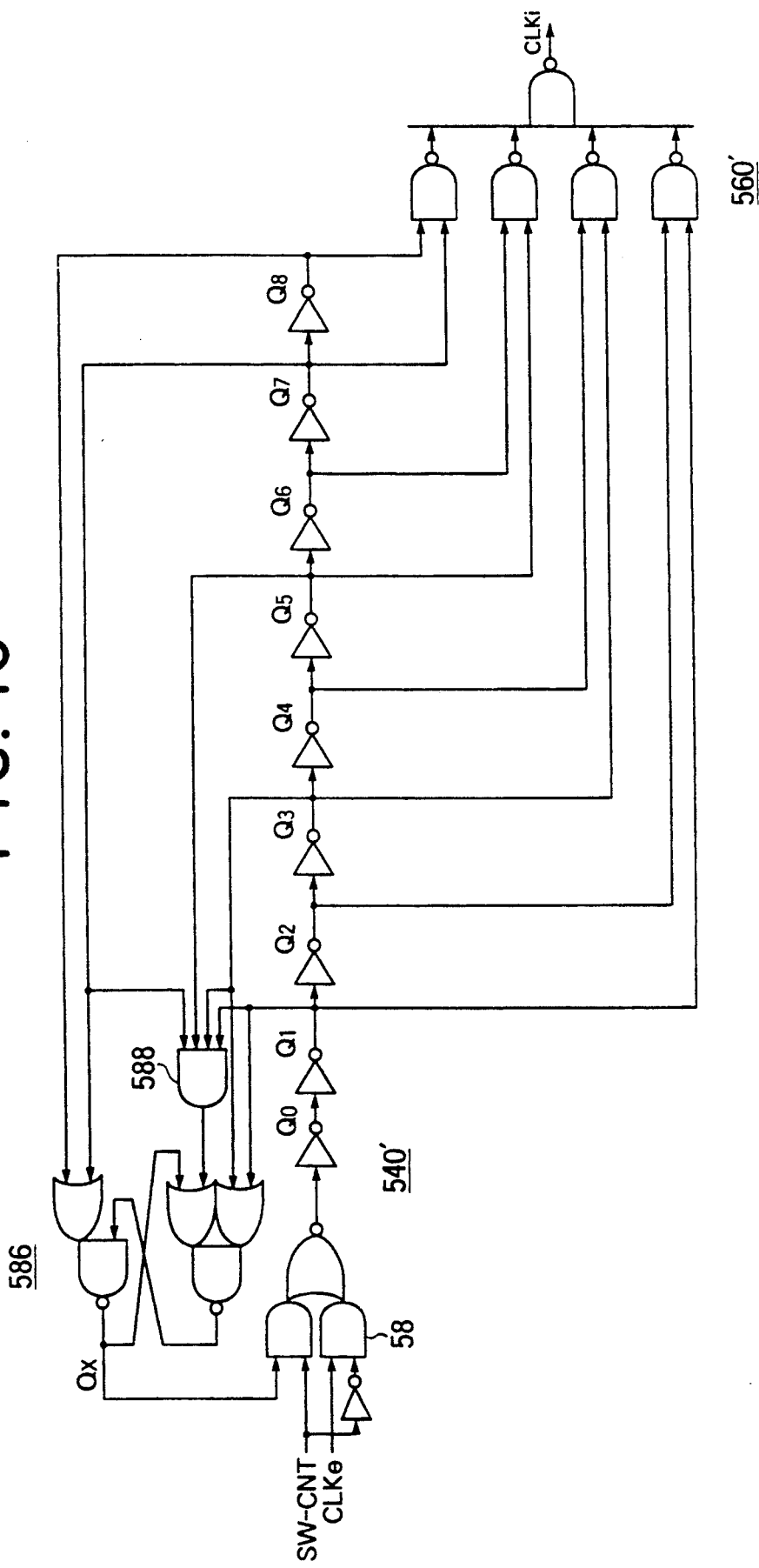
FIG. 16 is a circuit diagram showing another embodiment of an internal clock generation circuit in accordance with the present invention.

FIG. 16 shows a second embodiment of a synchronization decoding feedback circuit in an internal clock generation circuit according to the present invention. The function of this circuit is identical to that of the circuit shown in FIG. 14, and an example of when it is realized by another circuit construction is shown.

In FIG. 16, the synchronization decoding feedback circuit, as a digital VCO, includes a switching circuit 58, a nine series-connected current controlled driver 540', an internal clock generation circuit 560' consisting of four parallel-connected NAND gates and a NAND gate further making a NAND logic of the outputs of the NAND gates, and AND gate 588 inputting outputs $Q_1$, $Q_3$, $Q_5$ and $Q_7$ of odd drivers and detecting a status where these outputs are all logic "0", and a R-SFF 586. The function of the internal clock generation circuit 560' is the same as that of the internal clock generation circuit 560. The R-SFF 586 shown in FIG. 16 is a concrete circuit formed by a well known negative logic. Considering signals input to the AND gate 58, the R-SFF 586 and the AND gate 588, and referring to the timing shown in FIG. 15, the operation shown in FIG. 16 is the same as the operation shown in FIG. 14.

In the embodiments according to the present invention, a one tap circuit construction used in the transposed transversal filter, the serial multiplier used in the one tap circuit, and the internal clock generation PLL circuit used for the transversal filter, which can stably generate the internal clock on the basis of the external clock, and can test the inside circuit status from the outside, are respectively described. However, the applications of the one tap circuit construction, the serial multiplier and the PLI circuit are not limited to the transposed transversal filter, and can be applied to other transversal filters. In addition, the above mentioned circuits are merely examples, and when the present invention is realized, it is clear that various modifications similar to the above can be made, by a person with ordinary skill in the art to which the invention pertains.

In addition, the applications of the embodiments described above are not limited to the transversal filters, and can be applied to other uses or can be used independently. For example, when a plurality of series-connected serial multipliers require an adjustment of the decimal point positions, the above serial multiplier in accordance with the present invention can be applied. Furthermore, the PLL circuit in accordance with the present invention can be used to generate another clock on the basis of a clock, a frequency of the another clock being a multiple of a frequency of the clock.

EFFECTS OF THE INVENTION

As described above, in accordance with the present invention, a circuit construction of tap circuits and an arrangement for mounting the tap circuit are simplified, and thus a transversal filter with a high mounting efficiency can be realized.

Also, according to the present invention, a serial multiplier circuit having a simplified circuit construction, wherein a decimal point position is not shifted, can be realized.

Furthermore, according to the present invention, an internal clock used for driving a transversal filter circuit can be stably generated on the basis of an external clock, to accomplish a correct filter signal processing. Moreover, the generation of the internal clock can be easily tested externally, and thus a test can be performed without an adverse effect on other portions.

What is claimed is:

1. A transversal filter circuit comprising a plurality of tap circuits, each including a serial multiplication circuit having
   a bidirectional shift circuit for shifting a tap coefficient by a predetermined number of bits in one of two directions,
   a data input circuit for containing input data and providing the input data as an output in accordance with a predetermined pattern,
   a partial product calculation circuit respectively operably connected to the outputs of said bidirectional shift circuit and said data input circuit for calculating a partial product of said tap coefficient output from said bidirectional shift circuit and said input data as output from said data input circuit,
   an adding and holding circuit operably connected to the output of said partial product calculation circuit for adding an output from said partial product calculation circuit to a previously added value and holding the added output, and
   a control circuit operably connected to said bidirectional shift circuit and to said data input circuit and providing a control signal as an input thereto for controlling the shift direction of said bidirectional shift circuit and the data output direction of said data input circuit by alternatively changing the shift direction at each successive operation cycle,
   said serial multiplication circuit consecutively calculating and adding the partial product of a next tap coefficient and the input data for a plurality of times defined by a bit number of said input data, within each operation cycle.

2. A transversal filter circuit according to claim 1, wherein said data input circuit includes a serial shift register for shifting data therein by one bit at every partial product operation cycle, and
   said bidirectional shift circuit shifts the data therein by one bit at every partial product operation cycle.

3. A transversal filter circuit according to claim 1, wherein said data input circuit includes a two dimensional array data holding circuit constructed to carry out a Booth operation, and a Booth operation circuit, and
   said bidirectional shift circuit shifts the data therein by two bits at every partial product operation.

4. A transversal filter circuit comprising tap circuits, each including
   an addition circuit,
   an output register circuit connected to the output of said addition circuit for holding a result calculated at said addition circuit for a unit of time,
   a partial product calculation circuit connected to an input of said addition circuit for consecutively calculating a partial product of a tap coefficient and input data a plurality of times defined by a bit number of said input data at each operation cycle, adjusting a decimal point position and outputting the decimal point position adjusted data to another input of said addition circuit, and
   a multiplexer connected to said addition circuit and to said output register circuit for selectively outputting a result obtained at a preceding stage of a tap circuit and an output from said output register circuit to said addition circuit,
   said multiplexer outputting the result obtained at the preceding stage of a tap circuit to said addition circuit at only a first operation cycle, and the calculated result of said output register to said addition circuit at operation cycles following the first operation cycle, and
   a tap coefficient and input data being serially multiplied, the multiplied result and the result obtained at the preceding stage of a tap circuit being added, and the added result being delayed by a unit of time.

5. A transversal filter circuit comprising:
   an internal clock generation circuit for generating an internal clock as a clock for driving circuits in said transversal filter circuit in response to an external clock, a frequency of the internal clock being a multiple of a frequency of the external clock, said internal clock generation circuit comprising
   a phase comparison circuit having an input terminal for connection to the external clock,
   a loop filter connected to an output of said phase comparison circuit, and
   a digital voltage-controlled oscillation circuit for generating the internal clock in response to an output signal of said loop filter, as a control voltage, an output of the voltage-controlled oscillation circuit being connected to another input terminal of said phase comparison circuit;
   a digital switching circuit for selectively switching between the output of said voltage-controlled oscillation circuit and the external clock, and applying the output of said voltage-controlled oscillation circuit or the external clock to another input terminal of said phase comparison circuit; and
   an analog switching circuit for selectively switching between the output of said loop filter and an external control voltage, and applying the output of said loop filter or the external control voltage to said voltage-controlled oscillation circuit, and
   said digital and analog switching circuits being selectively energized or deenergized.

6. A transversal filter according to claim 5, wherein said digital voltage-controlled oscillation circuit includes a current controlled driver circuit, the internal clock being generated by a change of a decoded signal of the driver circuit and an output signal level of the driver circuit.

7. A clock generation circuit comprising
an internal clock generation circuit for generating a second clock in response to a first clock, a frequency of the second clock being a multiple of a frequency of the first clock,
said internal clock generation circuit comprising
a phase comparison circuit having an input terminal for connection to the first clock,
a loop filter connected to an output of said phase comparison circuit, and
a digital voltage-controlled oscillation circuit including a current controlled driver circuit having a plurality of current-controlled drivers controlled by the output of said loop filter, and generating the second clock in accordance with a change of a decoded signal of said driver circuit and an output signal level of said driver circuit, and the output of said digital voltage-controlled oscillation circuit being connected to another input terminal of said phase comparison circuit.

* * * * *